United States Patent
Nakajima et al.

(10) Patent No.: US 12,368,034 B2
(45) Date of Patent: Jul. 22, 2025

(54) SUPPORT BODY, MANUFACTURING APPARATUS FOR SUPPORT BODY, AND MANUFACTURING METHOD FOR SUPPORT BODY

(71) Applicants: KEIO UNIVERSITY, Tokyo (JP); IBARAKI UNIVERSITY, Mito (JP); NATIONAL INSTITUTE FOR MATERIALS SCIENCE, Tsukuba (JP); AYABO CORPORATION, Anjo (JP)

(72) Inventors: Atsushi Nakajima, Yokohama (JP); Hironori Tsunoyama, Yokohama (JP); Mika Uno, Hitachi (JP); Hiroyuki Gunji, Hitachi (JP); Toshihiro Ando, Tsukuba (JP); Keizo Tsukamoto, Anjo (JP); Masahide Tona, Anjo (JP); Naoyuki Hirata, Anjo (JP)

(73) Assignees: KEIO UNIVERSITY, Tokyo (JP); IBARAKI UNIVERSITY, Mito (JP); NATIONAL INSTITUTE FOR MATERIALS, Tsukuba (JP); AYABO CORPORATION, Anjo (JP)

(*) Notice: Subject to any disclaimer, the term of this patent is extended or adjusted under 35 U.S.C. 154(b) by 52 days.

(21) Appl. No.: 18/008,459

(22) PCT Filed: Jun. 8, 2021

(86) PCT No.: PCT/JP2021/021800
§ 371 (c)(1),
(2) Date: Dec. 6, 2022

(87) PCT Pub. No.: WO2021/251395
PCT Pub. Date: Dec. 16, 2021

(65) Prior Publication Data
US 2023/0203642 A1    Jun. 29, 2023

(30) Foreign Application Priority Data
Jun. 8, 2020 (JP) .................... 2020-099669

(51) Int. Cl.
*H01J 37/34* (2006.01)
*C23C 14/22* (2006.01)
(Continued)

(52) U.S. Cl.
CPC ........ *H01J 37/3467* (2013.01); *C23C 14/223* (2013.01); *C23C 14/228* (2013.01);
(Continued)

(58) Field of Classification Search
CPC .............. H01J 37/3467; H01J 37/3411; H01J 37/3488; C23C 14/223; C23C 14/35;
(Continued)

(56) References Cited

U.S. PATENT DOCUMENTS

| 10,283,333 B2* | 5/2019 | Nakajima ......... H01J 37/32715 |
| 2004/0038820 A1 | 2/2004 | Yunoki et al. |

(Continued)

FOREIGN PATENT DOCUMENTS

| DE | 102004049772 A1 * | 4/2006 | ............. C23C 14/22 |
| EP | 1728890 A1 | 12/2006 | |

(Continued)

OTHER PUBLICATIONS

Machine Translation DE 102004049772 (Year: 2006).*
(Continued)

*Primary Examiner* — Michael A Band
(74) *Attorney, Agent, or Firm* — Hayes Soloway PC

(57) ABSTRACT

Nanoclusters are produced in a gas phase using a nanocluster manufacturing section including: a vacuum container; a sputtering source that has a target as a cathode, performs magnetron sputtering by pulse discharge, and generates
(Continued)

plasma; a pulse power source that supplies pulsed power to the sputtering source; a first inert gas supply section that supplies a first inert gas to the sputtering source; a nanocluster growth cell that is contained in the vacuum container; and a second inert gas introduction section that introduces a second inert gas into the nanocluster growth cell. A multitude of supports are rolled in the gas phase and each of the supports is sprinkled with a multitude of nanoclusters to cause each support to support the multitude of nanoclusters.

12 Claims, 15 Drawing Sheets

(51) Int. Cl.
    *C23C 14/34*     (2006.01)
    *C23C 14/35*     (2006.01)
    *C23C 14/50*     (2006.01)
    *C23C 14/54*     (2006.01)
    *H01M 4/88*     (2006.01)

(52) U.S. Cl.
    CPC ........ *C23C 14/345* (2013.01); *C23C 14/3485* (2013.01); *C23C 14/35* (2013.01); *C23C 14/50* (2013.01); *C23C 14/541* (2013.01); *H01J 37/3411* (2013.01); *H01J 37/3488* (2013.01); *H01M 4/8871* (2013.01)

(58) Field of Classification Search
    CPC ... C23C 14/345; C23C 14/3485; C23C 14/50; C23C 14/541; C23C 14/228
    See application file for complete search history.

(56) References Cited

U.S. PATENT DOCUMENTS

| | | |
|---|---|---|
| 2007/0213212 A1 | 9/2007 | Abe et al. |
| 2008/0193764 A1 | 8/2008 | Ando et al. |
| 2016/0111262 A1 | 4/2016 | Nakajima et al. |
| 2018/0361340 A1 | 12/2018 | Nakajima et al. |
| 2019/0006697 A1* | 1/2019 | Danko ................ H01M 4/0426 |

FOREIGN PATENT DOCUMENTS

| | | |
|---|---|---|
| EP | 3351298 A1 | 7/2018 |
| JP | 2004136267 A | 5/2004 |
| JP | 2005264297 A | 9/2005 |
| JP | 2005335968 A | 12/2005 |
| JP | 2013047160 A | 3/2013 |
| JP | 2015045031 A | 3/2015 |
| JP | 2020015034 A | 1/2020 |
| JP | 2021094487 A | 6/2021 |
| WO | 2017030087 A1 | 2/2017 |

OTHER PUBLICATIONS

Furuhashi et al., "Electrochemical characterization of Pt-Pd/Marimo carbon catalyst for PEFC, Proceedings of the 56th Battery Symposium in Japan", Department of Biomolecular Functional Engineering. Iburaki University, 2015, English translation, p. 179,.

Baba et al., "Durable Marimo-like carbon support for Platinum nanoparticle catalyst in polymer electrolyte fuel cell", Elsevier, ScienceDirect, Electrochimica Acta, 2016, vol. 213, pp. 447-451, 5 pages.

Eguchi et al., "Influence of Ionomer/Carbon Ratio on the Performance of a Polymer Electrolyte Fuel Cell", Polymers, 2012, vol. 4, pp. 1645-1656, 12 pages.

Baba et al., "Interfacial Nanostructure of the Polymer Electrolyte Fuel Cell Catalyst Layer Constructed with Different Ionomer Contents", Japanese Journal of Applied Physics, 2013, vol. 52, Issue 6S, 5 pages.

Eguchi et al., "Preparation of catalyst for a polymer electrolyte fuel cell using a novel spherical carbon support", Elsevier, Journal of Power Sources, 2010, vol. 195, Issue 18, pp. 5862-5867, 6 pages.

Baba et al., "Preparation of catalyst for polymer electrolyte fuel cell using the Marimo-like carbon", J-STAGE, Transactions of the Materials Research Society of Japan, 2017, vol. 42, Issue 2, pp. 51-56, 6 pages.

Eguchi et al., "Preparation of the Pt-Co bimetallic catalyst on Marimo carbon for PEFC", J-STAGE, Transactions of the Materials Research Society of Japan, 2013, vol. 38, Issue 4, pp. 549-553, 5 pages.

Iwasawa et al., "Preparation of TiO2/Marimo carbon composite", J-STAGE, Transactions of the Materials Research Society of Japan, 2013, vol. 38, Issue 4, pp. 573-577, 5 pages.

Eguchi et al., "The Marimo carbon as a polymer electrolyte fuel cell catalyst support", J-STAGE, Transactions of the Materials Research Society of Japan, 2013, vol. 38, Issue 3, pp. 349-352, 4 pages.

International Preliminary Report on Patentability & Written Opinion of the International Searching Authority (with English translation) received in International Application PCT/JP2021/021800, Date of Issuance of the IPRP Dec. 13, 2022, Date of mailing of the Written Opinion of the International Search Authority Aug. 17, 2021, 9 pages.

Extended European Search Report, issued on Oct. 4, 2024, in the corresponding European patent application No. 21821014.4, 10 pages.

* cited by examiner

PARTICLE DIAMETER  3.03 ± 1.29 nm
d+3σ  6.91 nm

PARTICLE DIAMETER  2.74 ± 0.91 nm
d+3σ  5.48 nm

LIQUID PHASE Pt/MC

OBLATENESS (FRONT SURFACE)   0.28 ± 0.15
OBLATENESS (SIDE SURFACE)   0.32 ± 0.15

LIQUID PHASE Pt/KB

OBLATENESS (FRONT SURFACE)   0.31 ± 0.16
OBLATENESS (SIDE SURFACE)   0.26 ± 0.15

SUPPORT BODY, MANUFACTURING APPARATUS FOR SUPPORT BODY, AND MANUFACTURING METHOD FOR SUPPORT BODY

CROSS-REFERENCE TO RELATED APPLICATIONS

This patent application claims priority from PCT Patent Application No. PCT/JP2021/021800 filed Jun. 8, 2021, which claims priority from Japanese Patent Application No. JP 2020-099669 filed Jun. 8, 2020. Each of these patent applications are herein incorporated by reference in their entirety.

TECHNICAL FIELD

The present disclosure relates to a support body such as a catalyst, a manufacturing apparatus for a support body, and a manufacturing method for a support body.

BACKGROUND ART

Conventionally, for example, a platinum-based fuel cell catalyst is known as an electrode catalyst of a fuel cell. The platinum-based fuel cell catalyst is a support body in which a catalyst is supported on a support, and is produced by a liquid phase method (that is, wet process) including an impregnation method and a chemical reduction method. For example, see Patent Document 1 below.

As such catalyst, a catalyst composed of a nanocluster, which is an ultrafine particle including several to several thousand assembled atoms or molecules, or a catalyst having a fine particle diameter of about 0.2 nm to 8 nm in the case of a platinum-based fuel cell catalyst, is known.

PRIOR ART DOCUMENTS

Patent Documents

Patent Document 1: WO 2017/030087 A1

SUMMARY OF THE INVENTION

Problems to be Solved by the Invention

In recent years, for example, a technique of supporting nanoclusters having uniform sizes (that is, sizes of nanoclusters) on a support using the above-described liquid phase method has been studied.

However, in the case of producing a support body in which a catalyst is supported on a support by the liquid phase method, there are some problems to be solved.

Specifically, in order to reduce the amount of platinum used, it is conceivable to be effective to miniaturize particles of platinum (that is, platinum nanoclusters) as a catalyst. Therefore, ionic species as a platinum source, a concentration thereof, and a hydrogen ion concentration have been studied, and reduction agents for effectively desorbing ligands from platinum complex ions having different ligands to generate platinum nanoclusters have been studied.

However, under a condition where the reducing power is weak, the probability of generation of uniform nuclei of the platinum nanoclusters in the liquid phase is low, and the density of the platinum nanoclusters generated in the liquid tends to decrease, leading to a decrease in the number of the platinum nanoclusters. Furthermore, since a growth rate, at which a small number of nuclei generated becomes larger, is faster than a generation rate of uniform nuclei, the generated platinum nanoclusters tend to be large.

On the contrary, under a condition that the reducing power is strong, the ligand is easily desorbed, and the platinum nanoclusters are easily generated, the generation probability of the uniform nuclei of the platinum nanoclusters becomes too high, and the density of the uniform nuclei becomes high. Thus, as a distance between the generated uniform nuclei is too short, phenomena such as aggregation, coalescence, and grain growth of a plurality of nuclei occur, and there is a possibility that the sizes and shapes of the nanoclusters are not as intended.

In order to generate nanoclusters at a high concentration (high density) in the liquid phase, it is also conceivable to perform colloid protection for the purpose of preventing aggregation of the nanoclusters. However, when colloid protection is performed, active sites can be blocked or attachment to the support can be suppressed, and thus there is a possibility that the colloid protection has an undesirable influence on activity expression and high density support on a support surface. Here, the colloid protection refers to a state in which solvent molecules, organic molecules, molecular ions, proteins, and the like are adsorbed on the surface of the nanocluster.

An object of the present disclosure is to increase the number of nanoclusters supported on a support in a support body in which the nanoclusters are supported on the support, a manufacturing apparatus for the support body, and a manufacturing method for the support body. Another object of the present disclosure is to further reduce the size of the nanocluster. A further object of the present disclosure is to more suitably control the size and shape of the nanocluster. Yet another object of the present disclosure is to more suitably express an activity of the nanoclusters supported on the support and to suitably attach the nanoclusters to the support.

Means for Solving the Problems (1) A first aspect (support body) of the present disclosure is a support body in which a multitude of nanoclusters are supported on a support. The nanoclusters are produced in a gas phase (that is, in gas-phase synthesis) using a nanocluster generation apparatus including: a vacuum container; a sputtering source that has a target as a cathode, performs magnetron sputtering by pulse discharge, and generates plasma; a pulse power source that supplies pulsed power to the sputtering source; a first inert gas supply section that supplies a first inert gas to the sputtering source; a nanocluster growth cell that is contained in the vacuum container; and a second inert gas introduction section that introduces a second inert gas into the nanocluster growth cell. The multitude of nanoclusters are supported on each of the supports by rolling a multitude of supports in the gas phase and by sprinkling each of the supports (that is, each of multitude of supports) with the multitude of nanoclusters.

Here, sprinkling each support with a multitude of nanoclusters refers to supplying (that is, adding) a multitude of nanoclusters to each support to attach the multitude of nanoclusters to a surface of each support. By sprinkling each rolled support with the multitude of nanoclusters, for example, it is possible to substantially uniformly disperse and attach the multitude of nanoclusters over the entire surface of each support. The term "multitude" usually refers to a sufficient amount as a material for manufacturing a support body used for a catalyst or the like, for example.

Therefore, in the present first aspect, it is possible to further increase the number of the nanoclusters supported on the support. It is possible to further reduce the size of the nanocluster. The size and shape of the nanocluster to be supported can be more suitably controlled. For example, it is possible to support the multitude of nanoclusters having uniform sizes (that is, dimensions: sizes) on the surface of each support. Since protection with colloid as described above is not necessary, it is possible to achieve excellent activity expression and supporting of the nanoclusters at high density on the support surface. For example, it is possible to achieve a support state in which the nanoclusters are distributed on the surface of each support and directly bonded to the support so that the distribution state is substantially uniform at a desired density.

For example, the support and the nanoclusters can be combined without being exposed to the atmosphere. The combining is to bond together the surfaces of nanoclusters synthesized in the gas phase and the support having fixation sites to synergistically enhance an activity of the nanoclusters using support by the support. The fixation site is a site (place) in the support to which the nanoclusters can be more firmly attached than surroundings.

Examples of the gas phase include a vacuum having a predetermined pressure or less. The pressure in the gas phase is, for example, 40 Pa or less. Examples of a gas constituting the gas phase include an inert gas such as argon (Ar) or helium (He) (for example, inert gas used in nanocluster generation apparatus), nitrogen, and oxygen.

When such support body is applied to a fuel cell, that is, when a support body supporting a platinum catalyst, for example, is used in a fuel cell, performance of the fuel cell is greatly improved due to miniaturization (that is, atomization) of the platinum catalyst and the like. Hereinafter, the support body in which the catalyst is supported on the support may be referred to as a support body catalyst as an object having the function of the catalyst.

Since the platinum catalyst can be easily atomized, a ratio of surface atoms can be increased and the amount of platinum used can be reduced. Furthermore, as compared with a case where platinum nanoclusters serving as a catalyst are supported on a support in a liquid phase, the platinum nanoclusters are generated, for example, in high vacuum, and therefore platinum atoms on a platinum nanocluster surface are exposed and fresh (that is, clean), and impurities are less likely to be present at an interface between the platinum nanoclusters and the support, and therefore the platinum nanoclusters are in a good contact state with the support. Therefore, there is an advantage that surface diffusion of the platinum nanoclusters can be inhibited and in addition the platinum nanoclusters are less likely to fall off from the support. As a result, when such support body is used as a support body catalyst of a fuel cell, an activity of the support body catalyst is less likely to decrease.

Here, the platinum nanocluster refers to a nanosized fine particle having a particle diameter of, for example, 0.2 nm to 8 nm. Here, the particle diameter indicates a diameter (equivalent diameter) when converted into a circle in an image obtained by photographing the platinum nanocluster (as to particle diameter, the same applies hereinafter).

(2) In a second aspect (support body) of the present disclosure, a substance constituting the nanoclusters may be at least one type from a metal, an alloy, and a compound.

Examples include a substance that functions as a catalyst for a fuel cell or the like.

Examples of the metal include noble metals such as platinum, transition metals such as cobalt, and typical metals such as magnesium. Examples include platinum group metals such as Pt, Ru, Rh, Pd, and Ir, and transition metals such as Cu, Fe, Ni, Co, V, and Mn.

Examples of the alloy include alloys of a noble metal and a transition metal such as platinum-cobalt and alloys of a noble metal and a typical metal such as platinum-magnesium. Examples include alloys by combination of platinum and a platinum group such as Pt—Co, Pt—Ru, Pt—Rh, Pt—Pd, and Pt—Ir, combination of platinum and a transition metal such as Pt—Cu, Pt—Ni, and Pt—Co, and combination of a platinum group and a transition metal such as Pd—Ni.

Examples of the compound include oxides and complexes of platinum, and compounds such as carbon-nitrogen and silicon-carbon. Examples include compounds of $PtO_2$, PtO, and $H_2[Pt(OH)_6]$ and metal-chalcogenide compounds such as FeSe and $Cu_2(Ge,Sn)S_3$.

(3) In a third aspect (support body) of the present disclosure, the nanocluster may have a single-layer structure or a multilayer structure.

As a two-layer structure, a core-shell structure having different configurations on a center side and an outer peripheral side can be adopted.

(4) In a fourth aspect (support body) of the present disclosure, a substance constituting the support may be at least one type from carbon, an oxide, a nitride, a carbide, and a sulfide.

Examples of the oxide include metal oxides such as iron oxide. Examples include transition metal oxides such as $TiO_2$, TiO, $ZrO_2$, and ZrO, Li-transition metal oxides such as $LiFeO_2$, $Li_3MnO_3$, and $LiCoO_2$, SiO, and $SiO_2$.

Examples of the nitride include metal nitrides such as iron nitride. Examples include $Li_3N$, $Li_7MnN_4$, $Li_3FeN_2$, and Li-transition metal nitrides.

Examples of the carbide include WC and MoC.

Examples of the sulfide include $Li_2S$, $MoS_2Li_{10}$, $GeP_2S_{12}$, and $Li_7P_3S_{11}$.

(5) In a fifth aspect (support body) of the present disclosure, a substance constituting the support may be carbon black or marimo carbon.

The carbon black is fine particles of carbon having a particle diameter of, for example, about 3 nm to 500 nm. The marimo carbon is an sp3-sp2 carbon composite material in which a diamond fine particle of submicron order is used as a nucleus, and fibrous carbon nanofilaments (CNF) having a diameter of about 10 nm to 100 nm grow on the surface of the diamond fine particle to form a spherical shape as a whole.

(6) A sixth aspect (support body) of the present disclosure is a support body in which a multitude of nanoclusters are supported on a support, the support being marimo carbon. When viewed in an observation direction, distribution of oblateness of the multitude of nanoclusters on a side surface part on an outer peripheral side of the support may have an average value $-1\sigma$ of 0.20 or more. Note that $\sigma$ is a standard deviation, the $\pm 1\sigma$ section corresponds to a section of about 68% of the number of data, and the $\pm 3\sigma$ section corresponds to a section of about 99.7% of the number of data (the same applies hereinafter).

The side surface part of the support is a region (for example, region for two average particle diameters of nanocluster) from the outermost part (that is, outer periphery) of the support to an inside of a predetermined range in an image of the support body obtained by an electron microscope (for example, transmission electron microscope) as shown in experiment examples described later. The observation direction is a photographing direction (that is, direction perpendicular to image) of the electron microscope.

In a case where the oblateness of the multitude of nanoclusters (that is, nanocluster group) has such distribution, when the nanocluster group is used as a catalyst of, for example, a fuel cell, an effect of improving the catalytic activity per unit (same mass) platinum amount is obtained.

The support body of the present sixth aspect may be any of the support bodies of the first to fifth aspects.

(7) A seventh aspect (support body) of the present disclosure is a support body in which a multitude of nanoclusters are supported on a support, and distribution of a size of the multitude of nanoclusters supported on the support may have an average value +3σ of 5 nm or less.

In a case where the size of the multitude of nanoclusters (that is, nanocluster group) has such distribution, when the nanocluster group is used as a catalyst of, for example, a fuel cell, an effect of improving the catalytic activity per unit (same mass) platinum amount is obtained.

Here, the size of the nanocluster indicates the dimension of the nanocluster as described above. Specifically, it indicates a particle diameter of the nanocluster and a scale defining a range of the number of constituent atoms with improved accuracy.

The distribution described above has been obtained from an image of the support body taken with an electron microscope (for example, transmission electron microscope) as shown in the experiment examples described later.

The support body of the present seventh aspect may be any of the support bodies of the first to sixth aspects.

(8) An eighth aspect (support body) of the present disclosure is a support body in which a multitude of nanoclusters are supported on a support. The support has a structure in which a plurality of graphene sheets are laminated, and distribution of the number of edges (that is, edge number) of the graphene sheets with which each of the multitude of nanoclusters is in contact may have an average value +3σ of 5.5 or less.

In a case where the multitude of nanoclusters (that is, nanocluster group) have the above-described distribution, when the nanocluster group is used as a catalyst of, for example, a fuel cell, the catalytic activity per unit (same mass) platinum amount is improved. Also, even in long-time use, an effect that the nanoclusters are less likely to diffuse on the surface of the support and are less likely to fall off or peel off from the support can be achieved.

Here, the graphene sheet indicates a six-membered ring network of carbon constituting the carbon nanofilament, and the edge number indicates the number of ends exposed on the outer peripheral side of the graphene sheet.

The distribution described above has been obtained from an image of the support body taken with an electron microscope (for example, transmission electron microscope) as shown in the experiment examples described later.

The support body of the present eighth aspect may be any of the support bodies of the first to seventh aspects.

(9) A ninth aspect (manufacturing apparatus for support body) of the present disclosure relates to a manufacturing apparatus for a support body in which nanoclusters are supported on a support.

The manufacturing apparatus for the support body includes a nanocluster manufacturing section that produces the nanoclusters in a gas phase, and a supporting section that causes the support to support the nanoclusters in a gas phase.

The nanocluster manufacturing section includes: a vacuum container; a sputtering source that has a target as a cathode, performs magnetron sputtering by pulse discharge, and generates plasma; a pulse power source that supplies pulsed power to the sputtering source; a first inert gas supply section that supplies a first inert gas to the sputtering source; a nanocluster growth cell that is contained in the vacuum container; and a second inert gas introduction section that introduces a second inert gas into the nanocluster growth cell.

The supporting section includes a supporting mechanism that rolls a multitude of supports in the gas phase and sprinkles each of the supports with a multitude of nanoclusters to cause each of the supports to support the multitude of nanoclusters.

In the present ninth aspect, by rolling the multitude of supports and sprinkling each of the supports with the multitude of nanoclusters in the gas phase, each support is caused to support the multitude of nanoclusters.

Such sprinkling enables the above-described combination.

Such configuration achieves the same effect as that shown in the first aspect.

Specifically, by manufacturing the support body by the manufacturing apparatus for the support body of the present ninth aspect, it is possible to easily set, to a desired state, the state of the size of the nanoclusters to be supported on the support. For example, it is possible to support the nanoclusters having uniform dimensions (sizes). It is also possible to arrange the nanoclusters so as to have a substantially uniform distribution on the surface of the support.

When such support body thus manufactured is applied to a fuel cell, that is, when the support body supporting the platinum catalyst, for example, is used in the fuel cell, for example, when applied to a catalyst (for example, platinum catalyst) of the fuel cell, for example, performance of the fuel cell is greatly improved due to atomization of, for example, the platinum catalyst and the like. Since the platinum catalyst can be easily atomized, a ratio of surface atoms can be increased and an amount of the platinum used can be reduced. Furthermore, as compared with a case where platinum nanoclusters serving as a catalyst are supported on a support in a liquid phase, there is an advantage that the catalytic activity is less likely to decrease because a ligand used for suppressing aggregation of the platinum nanoclusters does not remain.

Since the platinum nanoclusters are generated, for example, in high vacuum, a platinum nanocluster surface is fresh (that is, clean), and impurities are less likely to be present at an interface between the platinum nanoclusters and the support, and therefore the platinum nanoclusters are in a good contact state with the support. Therefore, the platinum nanoclusters are less likely to diffuse on the surface of the support and are less likely to fall off from the support. As a result, when such support body is used as a fuel cell catalyst (that is, support body catalyst), there is an advantage that the activity of the support body catalyst is less likely to decrease.

As the nanocluster manufacturing section, the nanocluster generation apparatus described in Japanese Patent No. 5493139 (Patent Document 2) can be used.

(10) A tenth aspect (manufacturing apparatus for support body) of the present disclosure may further include a support manufacturing section that produces the support.

Since the present tenth aspect includes the support manufacturing section that produces the support, it is possible to easily and efficiently supply the support produced in the support manufacturing section onto the supporting section side. Furthermore, by consistently coupling the support manufacturing section and the supporting section so that the inside becomes vacuum, it is possible to cause the support to support the nanoclusters in a state where the support surface produced by the support manufacturing section is a clean surface or a chemisorption state of the support surface of the support is controlled.

As the support manufacturing section, an apparatus described in Japanese Patent No. 5544503 (Patent Document 3) can be used.

(11) In an eleventh aspect of the present disclosure (manufacturing apparatus for support body), the support manufacturing section may include a fixed bed or a fluidized bed for producing the support.

That is, the support may be manufactured using an apparatus including a fixed bed, or the support may be manufactured using an apparatus including a fluidized bed. The fluidized bed system may be a floating fluidized bed of a reactant gas flow system, or a fluidized bed of a rotary kiln system in which a reactor rotates.

(12) In a twelfth aspect (manufacturing apparatus for support body) of the present disclosure, the supporting mechanism may include a container that contains the multitude of supports and the multitude of nanoclusters, and may drive the container to roll the multitude of supports to be sprinkled with the multitude of nanoclusters.

That is, the multitude of supports may be placed in the container, and the multitude of supports may be rolled by rotating or vibrating the container, for example. By adding the multitude of nanoclusters to the multitude of supports thus rolling, it is possible to sprinkle each of the multitude of supports with the multitude of nanoclusters.

This makes it possible to cause many nanoclusters to be distributed (so as to uniform distribution state, for example) and supported on the surface of each support.

(13) In a thirteenth aspect (manufacturing apparatus for support body) of the present disclosure, the container is disposed in a path through which the nanoclusters are supplied so as to be capable of containing the nanoclusters.

In the present thirteenth aspect, the container is disposed in the path through which the nanoclusters are supplied. For example, when the nanoclusters are supplied downward in the vertical direction, the container can be disposed below the part from which the nanoclusters are supplied with the opening of the container facing upward. This makes it possible to reliably supply the nanoclusters to the container.

(14) In a fourteenth aspect (manufacturing apparatus for support body) of the present disclosure, a nanocluster control section that controls at least one of a size and a structure of the nanocluster may be disposed in a path through which the nanoclusters are supplied.

The nanocluster control section makes it possible to easily control at least one of the size and the structure of the nanocluster.

(15) A fifteenth aspect (manufacturing apparatus for support body) of the present disclosure may include a voltage control mechanism capable of applying a positive or negative bias voltage to the container.

When the nanoclusters are charged (that is, when they are ions), ions having a desired charge can be selectively contained in the container by applying a bias voltage to the container by the voltage control mechanism.

(16) A sixteenth aspect (manufacturing apparatus for support body) of the present disclosure may include a temperature control section that controls an inside of the supporting section to a predetermined temperature.

The temperature control section makes it possible to control the inside of the supporting section to a desired temperature.

The manufacturing apparatus for the support body of any of the ninth to sixteenth aspects may be the manufacturing apparatus that manufactures the support body of any of the first to eighth aspects.

(17) A seventeenth aspect (manufacturing apparatus for support body) of the present disclosure may include an activation mechanism that performs activation treatment on the support.

As described later, the activation treatment is to produce active points on the support and to enhance activity of active points already present. It has an action and an effect of causing the nanoclusters to strongly adhere to the surface of the support when applied to the fixation sites of the support.

(18) An eighteenth aspect (manufacturing method for support body) of the present disclosure relates to a manufacturing method for a support body in which nanoclusters are supported on a support.

The manufacturing method for a support body includes: a first process of producing the nanoclusters in a gas phase; and a second process of causing the support to support the nanoclusters in a gas phase In the first process, the nanoclusters are manufactured using an apparatus including: a vacuum container; a sputtering source that has a target as a cathode, performs magnetron sputtering by pulse discharge, and generates plasma; a pulse power source that supplies pulsed power to the sputtering source; a first inert gas supply section that supplies a first inert gas to the sputtering source; a nanocluster growth cell that is contained in the vacuum container; and a second inert gas introduction section that introduces a second inert gas into the nanocluster growth cell.

In the second process, a multitude of supports are rolled in the gas phase and each of the supports is sprinkled with a multitude of nanoclusters to cause each of the supports to support the multitude of nanoclusters.

The present eighteenth aspect has the same action and effects as those of the ninth aspect.

Specifically, by manufacturing the support body by the manufacturing method for the support body of the present eighteenth aspect, it is possible to easily set, to a desired state, the state of size of the nanoclusters to be supported on the support. For example, it is possible to support the nanoclusters having uniform dimensions (sizes). It is possible to distribute and support the nanoclusters having a substantially uniform distribution on the surface of the support.

When such support body thus manufactured is applied to a fuel cell, that is, when a support body supporting a platinum catalyst, for example, is used in a fuel cell, performance of the fuel cell is greatly improved due to atomization of the platinum catalyst and the like. Since the platinum catalyst can be easily atomized, the amount of platinum used can be reduced. Furthermore, as compared with a case where platinum nanoclusters serving as a catalyst are supported on a support in a liquid phase, there is an advantage that the catalytic activity is less likely to decrease because a ligand used for suppressing aggregation of the platinum nanoclusters does not remain.

Since the platinum nanoclusters are generated, for example, in high vacuum, platinum atoms on a platinum nanocluster surface are exposed and fresh (that is, clean), and impurities are less likely to be present at an interface between the platinum nanoclusters and the support, and therefore the platinum nanoclusters are in a good contact state with the support. Therefore, surface diffusion of the platinum nanoclusters is inhibited and the platinum nanoclusters are less likely to fall off from the support. As a result, when such support body is used as a fuel cell catalyst (that is, support body catalyst), there is an advantage that the activity of the support body catalyst is less likely to decrease.

(19) A nineteenth aspect (manufacturing method for support body) of the present disclosure may further include a third process of producing the support, and in the second process, the support produced in the third process may be used.

The present nineteenth aspect has the same action and effects as those of the tenth aspect.

As a method for producing the support in the third process, the same method as the method described in Patent Document 3 can be adopted.

(20) In a twentieth aspect (manufacturing method for support body) of the present disclosure, in the third process, the support may be produced using a fixed bed or a fluidized bed.

The present twentieth aspect has the same action and effects as those of the eleventh aspect.

(21) In a twenty-first aspect (manufacturing method for support body) of the present disclosure, the multitude of supports and the multitude of nanoclusters may be contained into a container, the container may be moved to roll the multitude of supports, and the multitude of nanoclusters may be supplied into the container.

The present twenty-first aspect has the same action and effects as those of the twelfth aspect.

(22) In a twenty-second aspect (manufacturing method for support body) of the present disclosure, the container may be disposed in a path through which the nanoclusters are supplied so as to be capable of containing the nanoclusters.

The present twenty-second aspect has the same action and effects as those of the thirteenth aspect.

(23) In a twenty-third aspect (manufacturing method for support body) of the present disclosure, at least one of a size and a structure of the nanocluster may be controlled in a path through which the nanoclusters are supplied.

The present twenty-third aspect has the same action and effects as those of the fourteenth aspect.

(24) In a twenty-fourth aspect (manufacturing method for support body) of the present disclosure, a positive or negative bias voltage may be applied to the container.

The present twenty-fourth aspect has the same action and effects as those of the fifteenth aspect.

(25) In a twenty-fifth aspect (manufacturing method for support body) of the present disclosure, a part for causing the support to support the nanoclusters may be controlled to a predetermined temperature.

The present twenty-fifth aspect has the same action and effects as those of the sixteenth aspect.

The manufacturing method for the support body of any of the eighteenth to twenty-fifth aspects may be the manufacturing method for manufacturing the support body of any of the first to eighth aspects. Activation treatment may be performed on the support before the second process.

BRIEF DESCRIPTION OF THE DRAWINGS

FIG. 3A is a front view showing a supporting unit and the like.

FIG. 3C is a plan view showing the rotary barrel and the like.

Figure 1:
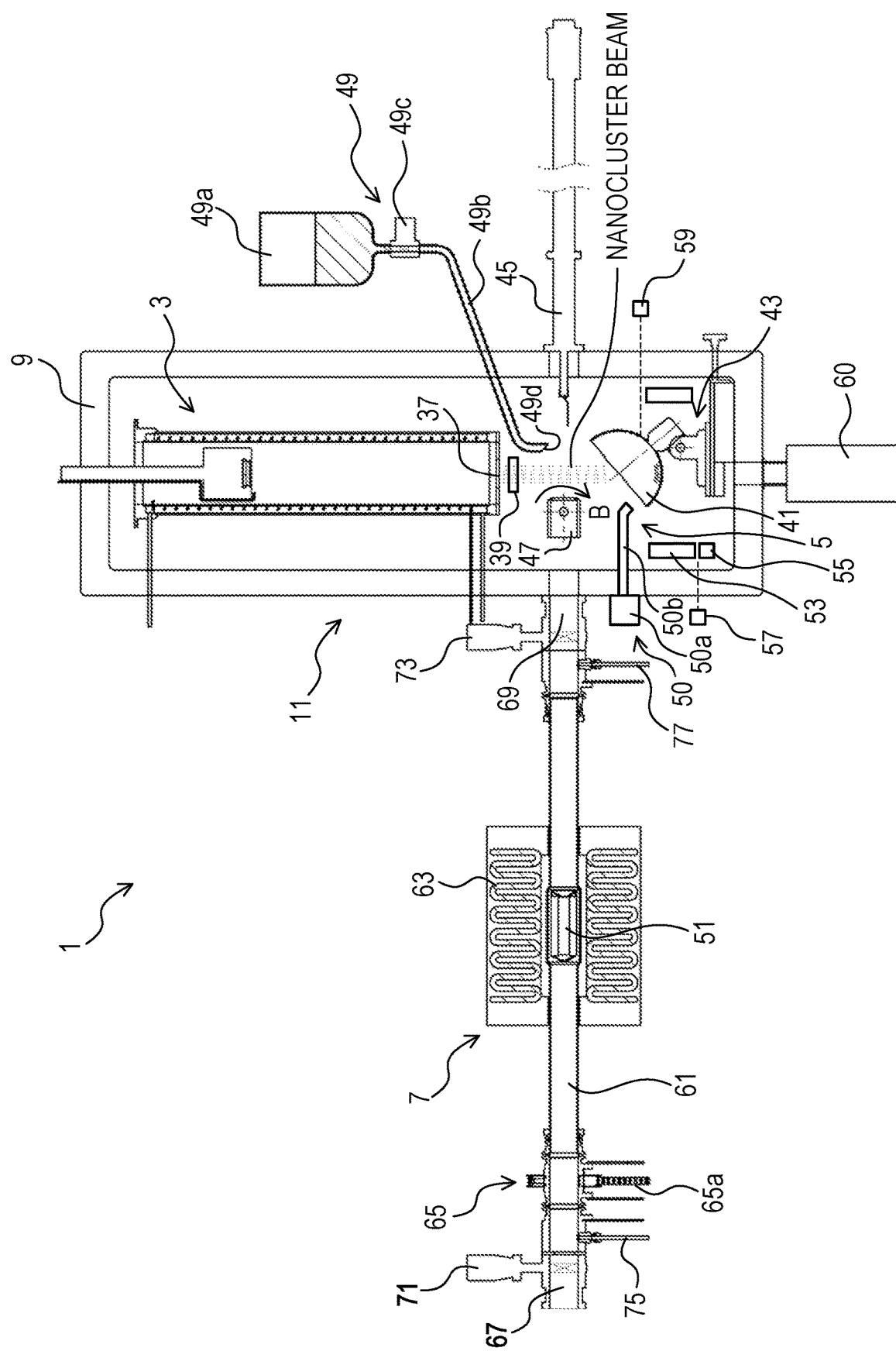
FIG. 1 is an explanatory view showing a manufacturing apparatus for a support body of a first embodiment.

EXPLANATION OF REFERENCE NUMERALS 1, 101 . . . manufacturing apparatus for support body, 3, 103 . . . nanocluster manufacturing unit, 5, 105 . . . supporting unit, 7, 107 . . . support manufacturing unit, 9, 109 . . . vacuum container, 11, 111 . . . composite device, 41, 113 . . . rotary barrel

MODE FOR CARRYING OUT THE INVENTION

Hereinafter, embodiments of the present disclosure will be described with reference to the drawings.

1. FIRST EMBODIMENT

1-1. Apparatus

First, a manufacturing apparatus for a support body of the present first embodiment will be described.

Here, a manufacturing apparatus for a support body in which a catalyst is supported on a support will be described.

As shown in FIG. 1, a manufacturing apparatus 1 for a support body of the present first embodiment is an apparatus that integrally includes a nanocluster manufacturing unit 3 that produces a catalyst in a gas phase, a supporting unit 5 that causes a support to support the catalyst in a gas phase, and a support manufacturing unit 7 that produces a support in a gas phase.

Since the nanocluster manufacturing unit 3 and the supporting unit 5 are integrally configured with a tubular vacuum container 9 as a common configuration, the nanocluster manufacturing unit 3 and the supporting unit 5 may be hereinafter referred to as a composite device 11.

The catalyst includes, for example, a nanocluster that is a fine particle having a particle diameter of 0.2 nm to 8 nm, and its material is, for example, platinum. The nanocluster is an ultrafine particle in which several to several thousand atoms (for example, platinum) or molecules are assembled.

The support is, for example, a fine particle having a particle diameter of 50 μm to 100 μm, and includes, for example, known marimo carbon (that is, MC).

Figure 5A:
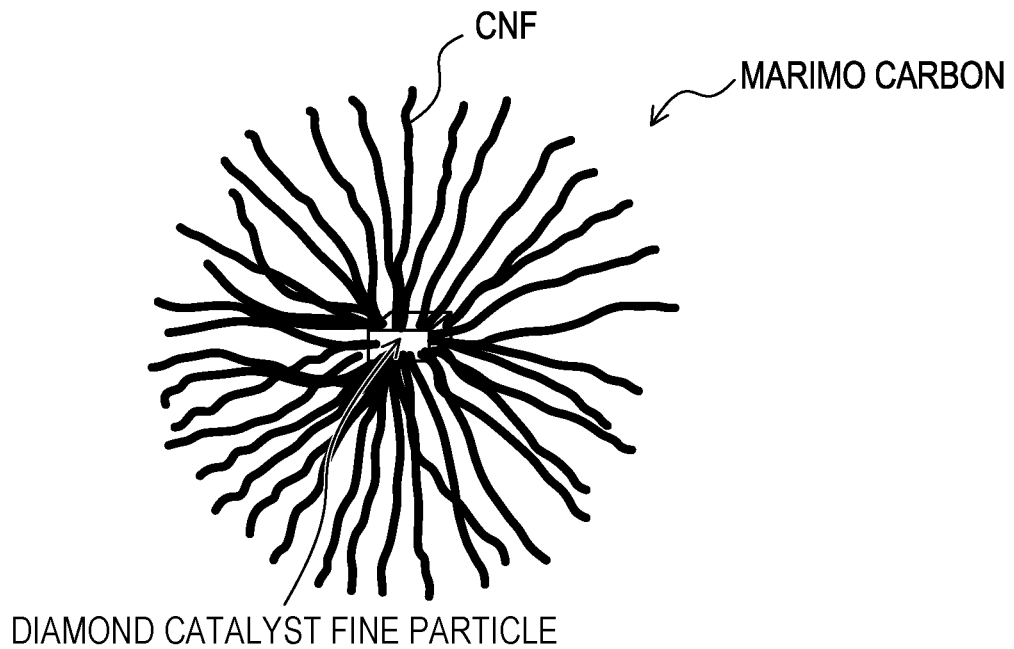
FIG. 5A is an explanatory view schematically showing marimo carbon.
Figure 5B:
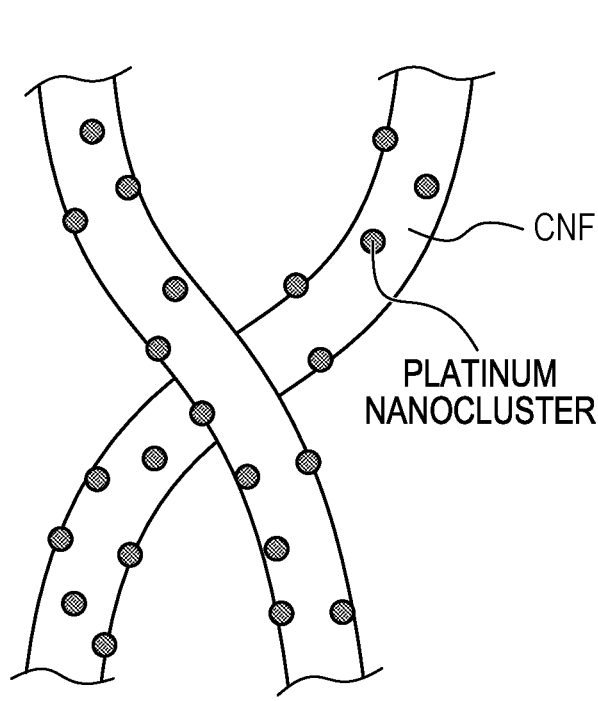
FIG. 5B is an explanatory view schematically showing a state in which a catalyst is attached to a carbon nanofilament.
Figure 5C:
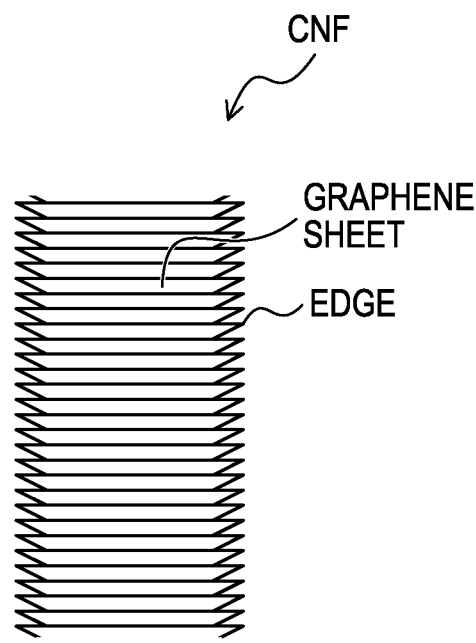
FIG. 5C is an explanatory view schematically showing a laminated state of graphene sheets in the carbon nanofilament.

The marimo carbon is a type of carbon nanofilament (CNF)-based nanocarbon material as described in, for example, Japanese Patent No. 5854314 (Patent Document 4). As shown in FIGS. 5A to 5C described later, the marimo carbon is a nanocarbon material having a spherical form like a marimo (spherical moss) obtained by radially growing fibrous carbon nanofilaments (CNF) with a diamond fine particle as a nucleus.

Each configuration will be described below.
<Nanocluster Manufacturing Unit>

First, the nanocluster manufacturing unit 3 will be described.

The nanocluster manufacturing unit 3 is a device that synthesizes and produces nanoclusters in a gas phase. Since the nanocluster manufacturing unit 3 has a configuration basically similar to that of the nanocluster generation apparatus described in Patent Document 2, the nanocluster manufacturing unit 3 will be briefly described.

Figure 2:
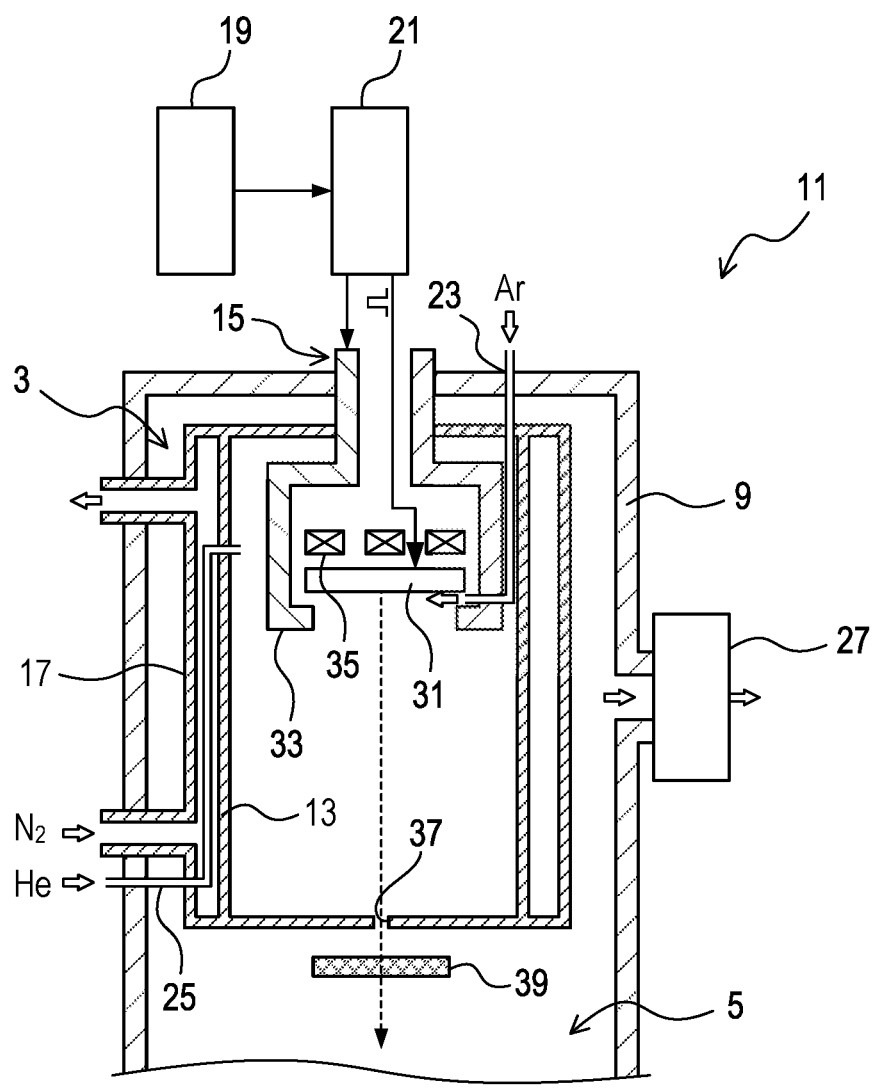
FIG. 2 is an explanatory view showing a nanocluster generation apparatus and the like constituting a part of the manufacturing apparatus for the support body.

As shown in FIG. 2, the nanocluster manufacturing unit 3 includes the vacuum container 9, a nanocluster growth cell 13, a sputtering source 15, a liquid nitrogen jacket 17, a control device 19, a pulse power source 21, a first inert gas supply unit 23, and a second inert gas introduction unit 25.

As the vacuum container 9, a known vacuum chamber can be used. An exhaust unit 27 is connected to the vacuum container 9. The exhaust unit 27 increases the degree of vacuum in the vacuum container 9. A turbo molecular pump or the like can be used for the exhaust unit 27. The exhaust unit 27 can exhaust inside the vacuum container 9 up to, for example, the degree of vacuum of $10^{-1}$ Pa to $10^{-7}$ Pa.

The nanocluster growth cell 13 is installed in the vacuum container 9. The outer periphery of the nanocluster growth cell 13 is surrounded by the liquid nitrogen jacket 17. Liquid nitrogen ($N_2$) flows through a region surrounded by the outer periphery of the nanocluster growth cell 13 and the inner periphery of the liquid nitrogen jacket 17. By circulating liquid nitrogen in this region, it is possible to suppress an increase in temperature in the nanocluster growth cell 13 and to cool the He gas supplied from the second inert gas introduction unit 25.

The sputtering source 15 includes a target 31, an anode 33, and a magnet unit 35. The sputtering source 15 is disposed inside the nanocluster growth cell 13 disposed in the vacuum container 9. The sputtering source 15 is movable in a tube axis direction in the nanocluster growth cell 13. This makes it possible to freely define an extension distance of a nanocluster growth region in the tube axis direction. In other words, it is possible to freely define a growth region length, which is the distance from the target 31 surface to a nanocluster extraction port 37 of the nanocluster growth cell 13.

The nanoclusters manufactured by the nanocluster manufacturing unit 3 are emitted from the nanocluster extraction port 37 toward the supporting unit 5 side (lower side in FIG. 2). Note that the path through which the nanoclusters are supplied has a certain region, and the nanoclusters supplied along the region are referred to as a nanocluster beam.

The target 31 functions as a cathode and is connected to the pulse power source 21. The pulse power source 21 is controlled by the control device 19. Pulsed power is supplied from the pulse power source 21 to the sputtering source 15, whereby a voltage is applied between the target 31 and the anode 33. The magnet unit 35 applies a magnetic field near the surface of the target 31.

The material used for the target 31 can be variously changed according to the nanoclusters desired to produce. For example, when it is desired to produce a platinum nanocluster, the target 31 is platinum.

The control device 19 controls the pulse power source 21. The pulse power source 21 applies voltage in an on-time $t_{on}$ and stops applying the voltage in an off-time $t_{off}$ in accordance with an on-signal and an off-signal from the control device 19, and thus applies a pulsed voltage to the sputtering source 15. For example, as the pulse power source 21, a modulated pulse power source or the like capable of controlling power by a duty ratio ($t_{on}/(t_{on}+t_{off})$) and a direct-current voltage DCV can be used. As the pulse power source 21, a stationary direct-current voltage DCV type power source may be used.

The first inert gas supply unit 23 is a gas flow path having an end disposed between the target 31 and the anode 33. The gas flow path can include a known pipe or the like. In FIG. 2, only one supply port of the first inert gas supply unit 23 is provided between the target 31 and the anode 33. The first inert gas supply unit 23 is not limited to this configuration, and the first inert gas supply unit 23 may be branched in the middle to provide a plurality of supply ports. It is only required to be a configuration in which the first inert gas can be introduced to the surface of the target 31. The first inert gas is only required to be a gas that can be used for general sputtering, and Ar gas can be generally used.

When the first inert gas is supplied from the first inert gas supply unit 23 to the target 31 surface, a strong glow discharge is generated near the surface of the target 31. The first inert gas is ionized by glow discharge and collides with the target 31, whereby sputtered particles are emitted from the target. The sputtered particles are composed of neutral atoms, ions, and the like derived from the target 31.

The second inert gas introduction unit 25 is a gas flow path spirally circulating inside the liquid nitrogen jacket 17 and having an end protruding into the nanocluster growth cell 13. The gas flow path can include a known pipe or the like. The second inert gas is not particularly limited as long as it is gas species that does not react with generated sputtered particles. For example, He gas or the like can be suitably used.

The second inert gas introduction unit 25 supplies the second inert gas cooled by liquid nitrogen into the nanocluster growth cell 13. The second inert gas introduction unit 25 is preferably controlled by a pressure gauge, a mass flow controller, or the like. The pressure in the nanocluster growth cell 13 can be maintained at about 0.1 Pa to 40 Pa by a pressure gauge or the like.

The second inert gas introduced from the second inert gas introduction unit 25 has a certain flow direction, and the sputtered particles generated in the target 31 move along the flow direction. At this time, the sputtered particles are bonded together in a second inert gas atmosphere, and various nanoclusters are generated.

As described in Patent Documents 1 and 2, the size of the nanocluster can be freely selected by controlling a discharge power in the sputtering source 15, a duty ratio in the pulse power source 21, a growth region length in the nanocluster growth cell 13, a flow rate of the first inert gas supplied from the first inert gas supply unit 23, a flow rate of the second inert gas supplied from the second inert gas introduction unit 25, and the like.

A gate 39 is disposed below (lower in FIG. 2) the nanocluster extraction port 37 on the supporting unit 5 side, that is, in a path through which the nanoclusters are supplied to the supporting unit 5 side.

The gate 39 is, for example, a metal mesh electrode, and is used for permitting or prohibiting passage of nanoclusters, specifically, only nanocluster ions of one polarity among nanocluster ions.

The gate 39 is used as described in Patent Document 2. That is, the timing of switching between permission and prohibition of extraction of the ion beam from the nanocluster extraction port 37 by the gate 39 is set based on the timing of starting the supply of pulsed power to the sputtering source 15.

This makes it possible to selectively extract, by operating the gate 39, only the nanocluster ions (that is, ion beam) reaching the nanocluster extraction port 37 in a specific time slot. Thus, for example, nanoclusters having a particular size or structure can be selected.

<Supporting Unit>

Next, the supporting unit 5 will be described.

The supporting unit 5 is a device that causes each support to support a multitude of nanoclusters by rolling a multitude of supports and sprinkling each of the supports with a multitude of nanoclusters in a gas phase.

The outer periphery of the supporting unit 5 is integrally configured by the vacuum container 9 constituting the outer periphery of the nanocluster manufacturing unit 3.

As shown in FIG. 1, the supporting unit 5 includes a rotary barrel 41, a rotary barrel drive mechanism 43, a transfer rod 45, a synthetic cell rotary mechanism 47, a dispersion medium drop mechanism 49, and an activation mechanism 50. Note that the activation mechanism 50 and the dispersion medium drop mechanism 49 may be omitted.

The rotary barrel 41 and the rotary barrel drive mechanism 43 constitute a supporting mechanism. The dispersion medium drop mechanism 49 constitutes a liquid supply unit.

The rotary barrel 41 is a hemispherical member, and is rotatable around an axis, for example, in a clockwise direction (in direction A of FIGS. 3B and 3C) as viewed from above in FIG. 1.

Figure 3A:
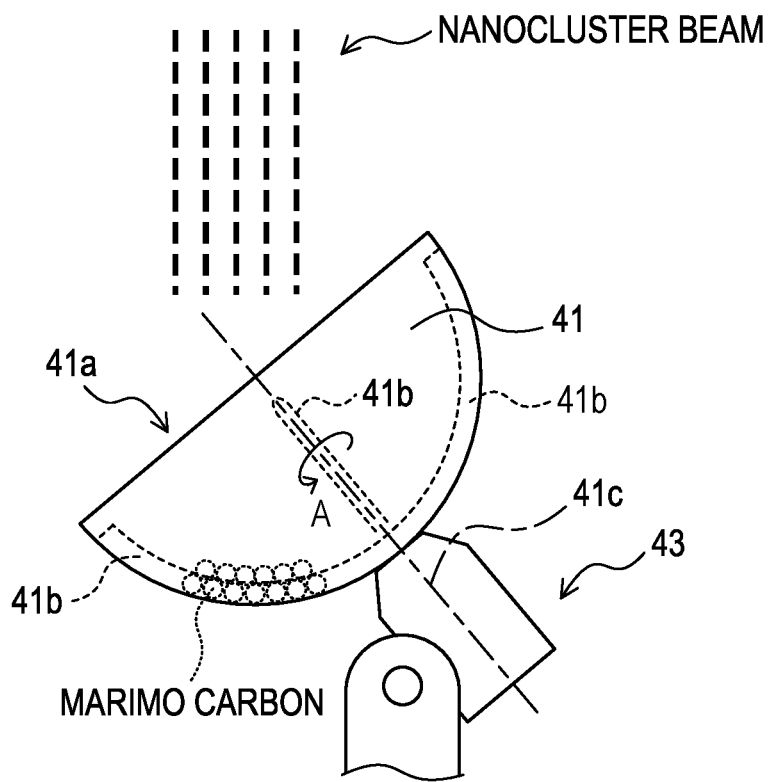
Figure 3B:
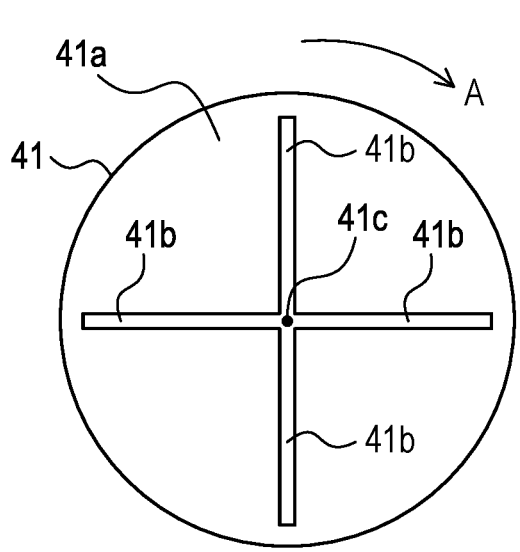
FIG. 3B is an explanatory view showing a state in which a rotary barrel is viewed in a direction of a rotation axis of the rotary barrel.
Figure 3C:
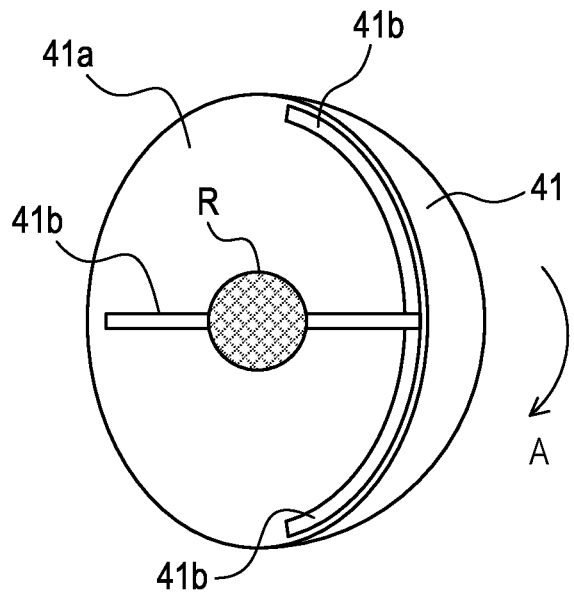

Specifically, as shown in FIGS. 3A to 3C, the rotary barrel 41 has a circular opening 41a, and is a container that contains fine particle-like supports (for example, marimo carbon) and nanoclusters. Specifically, the rotary barrel 41 is a container used for containing and rotating a multitude of supports inside to roll each support and for sprinkling each support with a multitude of nanoclusters using a multitude of nanoclusters supplied from the nanocluster manufacturing unit 3.

The inner peripheral surface of the rotary barrel 41 is provided with a plurality of protrusions 41b for stirring so as to sufficiently roll the supports, that is, to sufficiently sprinkle the nanoclusters on the supports. A plurality of (for example, four) protrusions 41b are provided radially from the bottom of the rotary barrel 41 (part of rotary shaft 41c) toward the opening 41a. Note that, instead of the protrusion 41b, for example, a configuration of a recess may be adopted.

The rotary shaft 41c of the rotary barrel 41 is inclined at a predetermined angle (for example, 30°) with respect to a vertical line. The opening 41a opens toward an upper space, from which the nanoclusters are supplied. The opening 41a has an elliptical shape as viewed from above.

The rotary barrel 41 is set so that the nanocluster beam reaches a central part (R part in FIG. 3C) of the opening 41a when viewed from above.

The rotary barrel drive mechanism 43 is a mechanism that rotates the rotary barrel 41, for example, in a direction of an arrow A by a motor (not illustrated) or the like.

As shown in FIG. 1, the transfer rod 45 is a device that extracts the supports manufactured by the support manufacturing unit 7 together with a synthetic cell 51 described later. That is, since the manufactured fine particles-like supports are contained in the synthetic cell 51, an inner cylinder (not illustrated) of the synthetic cell 51 in which the supports are contained can be retained at the tip end of the transfer rod 45 and pulled out into the vacuum container 9.

The synthetic cell rotary mechanism 47 is a device that retains an inner cylinder of the synthetic cell 51 pulled out at the tip end of the transfer rod 45. The synthetic cell rotary mechanism 47 is a tubular member, and can retain the inner cylinder of the synthetic cell 51 inside thereof. The synthetic cell rotary mechanism 47 is rotatable in a direction of an arrow B, for example.

Therefore, by turning, in an arrow B direction, the synthetic cell rotary mechanism 47 retaining the inner cylinder of the synthetic cell 51, it is possible to supply the supports contained in the inner cylinder of the synthetic cell 51 into the rotary barrel 41 so as to drop the supports into the opening 41a.

Although not illustrated, when the synthetic cell rotary mechanism 47 is turned in the arrow B direction, the supports can be supplied to the rotary barrel 41 from the opening on the tip end side (right side in FIG. 1) of the inner cylinder of the synthetic cell 51.

The dispersion medium drop mechanism 49 is a device that supplies a dispersion medium that is a liquid into the rotary barrel 41 in order to produce a slurry.

The dispersion medium drop mechanism 49 includes a tank 49a for storing a dispersion medium outside the vacuum container 9, and includes a pipe line 49b extending from the tank 49a into the vacuum container 9. The middle of the pipe line 49b outside the vacuum container 9 is provided with an opening/closing part 49c for opening/closing the pipe line 49b, and the tip end of the pipe line 49b inside the vacuum container 9 of the pipe line 49b includes an opening 49d for dropping the dispersion medium. The opening 49d is disposed above the opening 41a so that the dispersion medium can be dropped into the opening 41a of the rotary barrel 41.

The activation mechanism 50 is a device for activating the supports disposed in the rotary barrel 41.

The activation mechanism 50 includes, outside the vacuum container 9, an external device 50a that generates, for example, hydrogen plasma used for activation of the supports, and includes a pipe line 50b extending from the external device 50a into the vacuum container 9. The tip end of the pipe line 50b is disposed at a position where, for example, hydrogen plasma can be induced in the rotary barrel 41. Note that irradiation may be performed directly from the external device 50a even without the pipe line 50b.

In the vacuum container 9, specifically, in the supporting unit 5, a heater 53 and a temperature sensor 55 are disposed as a configuration that controls the temperature in the supporting unit 5. Outside the vacuum container 9, a control device 57 that adjusts power supplied to the heater 53 is disposed.

The supporting unit 5 can be cooled by providing, outside the vacuum container 9, a configuration that supplies cooling water or the like.

Furthermore, outside the vacuum container 9, a voltage control mechanism 59 capable of applying a positive or negative bias voltage to the rotary barrel 41 is disposed in order to apply a positive or negative bias voltage to the rotary barrel 41.

An ion detection device 60 is connected to the outside of the vacuum container 9 below the supporting unit 5 so as to communicate with the inside of the supporting unit 5. As the ion detection device 60, a device similar to the ion detection device described in Patent Document 2 can be used.

Specifically, although not illustrated, in the ion detection device 60, first, only one of positive ions and negative ions in the nanoclusters is extracted by being deflected by the quadrupole ion deflector. Then, the mass of the extracted nanoclusters is analyzed by a quadrupole mass spectrometer, only nanoclusters having a specific mass are extracted, the number of atoms and the composition are selected, and the generation amount is measured by an ion detector capable of applying a bias.

<Support Manufacturing Unit>

Next, the support manufacturing unit 7 that produces a support in a gas phase will be described.

First, the configuration of the support manufacturing unit 7 will be described.

The support manufacturing unit 7 is a CVD device that synthesizes marimo carbon as a support in a fixed bed.

As shown in FIG. 1, the support manufacturing unit 7 includes a pipe 61, the synthetic cell 51, a heater 63, a pipe rotation mechanism 65, a first connection unit 67 and a second connection unit 69, a first gate valve 71 and a second gate valve 73, a gas supply unit 75, and a gas discharge unit 77.

The pipe 61 is a cylindrical member, and is configured to be rotatable about a rotation axis by the pipe rotation mechanism 65.

The pipe rotation mechanism 65 is a device that rotates a belt 65a applied to the outer periphery of the pipe 61 by a motor not illustrated, for example, and rotates the pipe 61 by the belt 65a.

The synthetic cell 51 is a container for containing diamond fine particles each serving as a nucleus of a support, and has a double structure of an inner cylinder and an outer cylinder (not illustrated). The synthetic cell 51 (specifically, inner cylinder and outer cylinder) has a mesh shape so as to allow a gas to pass therethrough while prohibiting the diamond fine particles from passing therethrough. The synthetic cell 51 rotates with the rotation of the pipe 61 and is heated by the heater 63. The inner cylinder of the synthetic cell 51 is configured such that it can be carried out to the supporting unit 5 side in the pipe 61.

The heater 63 is disposed so as to surround the periphery of the synthetic cell 51 (that is, periphery of pipe 61) so as to be able to heat the rotating synthetic cell 51.

The first connection unit 67 is a tubular member, and is connected at the left end of the pipe 61 so as to be able to rotate the pipe 61. Similarly, the second connection unit 69 is a tubular member, and is connected at the right end of the pipe 61 so as to be able to rotate the pipe 61. The second connection unit 69 is connected to the vacuum container 9 to provide communication between the inside of the pipe 61 and the inside of the vacuum container 9.

The first gate valve 71 is provided in the first connection unit 67, and opens/closes the first connection unit 67. Similarly, the second gate valve 73 is provided in the second connection unit 69, and opens/closes the second connection unit 69.

The gas supply unit 75 is provided in the first connection unit 67 on the synthetic cell 51 side relative to the first gate valve 71, and is configured to supply a gas into the pipe 61.

The gas discharge unit 77 is configured to discharge a gas from the inside of the pipe 61 on the synthetic cell 51 side relative to the second gate valve 73.

Next, a manufacturing method for marimo carbon by the support manufacturing unit 7 will be described.

In the present first embodiment, a diamond catalyst fine particle having an oxidized surface (that is, oxidized diamond fine particle) and having a transition metal catalyst supported on the surface thereof is heated and reacted in a gas phase containing hydrocarbon. Due to this, carbon nanofilaments are isotropically and radially grown from the diamond catalyst fine particle as nucleus, whereby marimo carbon having a substantially spherical form including a multitude of carbon nanofilaments grown in a marimo shape is manufactured.

Details will be described below.

First, the diamond catalyst fine particles each having the oxidized surface and having the transition metal catalyst supported on the surface thereof are disposed in the synthetic cell 51 (specifically, inner cylinder), and the first and second gate valves 71 and 73 are closed.

Next, the synthetic cell 51 is heated to a predetermined reaction temperature by the heater 63 while rotating the pipe 61.

Next, a hydrocarbon-containing gas is supplied into the pipe 61 at a predetermined flow rate from the gas supply unit 75, and the hydrocarbon-containing gas in the pipe 61 is discharged to the outside from the gas discharge unit 77. The predetermined flow rate of the gas is such flow rate that the diamond catalyst fine particles are stirred in the synthetic cell 51, and can be appropriately selected according to the size and shape of the synthetic cell 51 and the amount of the diamond catalyst fine particles.

The particle diameter of the diamond catalyst fine particles serving as growth nuclei is preferably in a range of 200 nm to 800 nm, and more preferably in a range of 200 nm to 500 nm.

The reaction temperature is an important control factor, and in general, a range of 400° C. to 600° C. is preferable in a case where Ni, Cr, or Pd is used as the catalyst and methane is used as the hydrocarbon gas.

As the hydrocarbon gas to be used, methane and/or ethane is preferably used. In addition to the hydrocarbon gas, a reaction assist gas, a dilution gas, and the like can be appropriately mixed as necessary.

In this manner, by selecting the reaction temperature in the range of 400° C. to 600° C. and constantly and strictly retaining the reaction temperature to the selected temperature, it is possible to obtain marimo carbon having a uniform microstructure. That is, by selecting the reaction temperature and strictly retaining the reaction temperature to the selected temperature, it is possible to quantitatively control a half apex angle of a conical (conical cup) graphene sheet as a primary structure, and it is possible to obtain marimo carbon having a relatively uniform distribution of the half apex angle.

1-2. Manufacturing Method

Next, a manufacturing method for a support body in the present first embodiment will be described with reference to FIGS. 4, 5A to 5C, and the like.

a) Manufacturing of Support

First, a manufacturing method for a support will be described.

Figure 4:
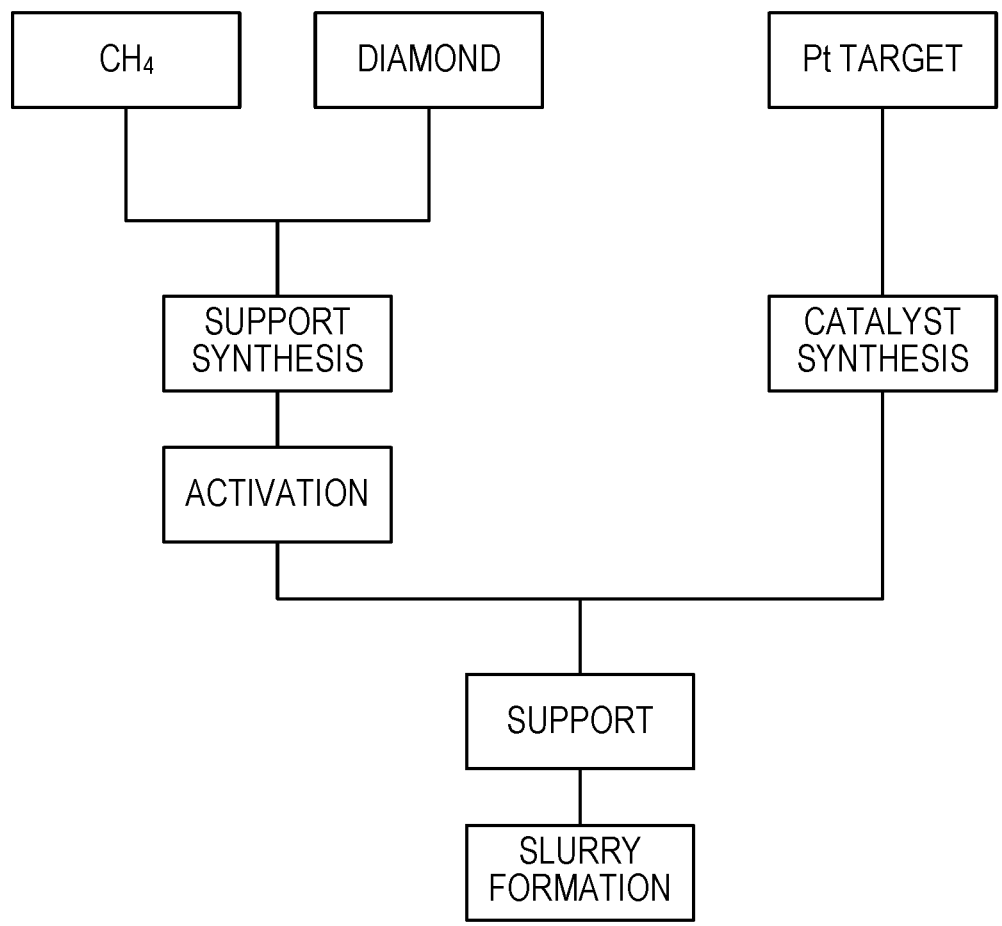
FIG. 4 is a process chart showing a manufacturing method for the support body of the first embodiment.

As shown in FIG. 4, since production of marimo carbon as a support is performed by the support manufacturing unit 7 as described above, production of marimo carbon will be briefly described.

In the support manufacturing unit 7, marimo carbon is synthesized in a gas phase. Specifically, a multitude of diamond catalyst fine particles serving as growth nuclei are disposed in the synthetic cell (specifically, inner cylinder) 51, a hydrocarbon gas such as methane is supplied at a predetermined temperature, and a multitude of marimo carbon are manufactured by gas phase synthesis.

The configuration of the marimo carbon is schematically shown in FIG. 5A. The marimo carbon is a substantially spherical support, and a multitude of fibrous carbon nano-filaments (CNF) radially extend from the diamond catalyst fine particle in the central part toward the outer peripheral side.

Next, the marimo carbon thus manufactured may be subjected to activation treatment by ozone oxidation cleaning, hydrogen plasma, or the like using the activation mechanism 50. The activation treatment is treatment for strongly fixing a catalyst composed of nanoclusters to the marimo carbon by supplying ozone, hydrogen plasma, or the like to the support (here, marimo carbon) to produce a fixation site of the marimo carbon or to enhance the activity of the fixation site.

b) Synthesis of Catalyst

Next, a production method for nanoclusters serving as a catalyst (that is, synthesis method for catalyst) will be described. Here, platinum will be described as an example of the catalyst. That is, a production method for nanoclusters made of platinum (that is, platinum nanocluster) will be described as an example.

The production of the platinum nanoclusters serving as the catalyst is performed by the nanocluster manufacturing unit 3 described above.

Since the production method for the platinum nanoclusters is described in Patent Documents 1 and 2, the production method will be briefly described.

In the case of producing the platinum nanocluster, as shown in FIG. 2, first, in a state where the second inert gas cooled to liquid nitrogen temperature is introduced into the nanocluster growth cell 13, the first inert gas is supplied to the sputtering source 15, and pulse power is supplied from the pulse power source 21 for a sputtering source.

When the pulse power is supplied, a multitude of sputtered particles (that is, platinum particles) such as neutral atoms and ions derived from the target 31 are emitted as a group from the platinum target (that is, Pt target) 31 into the second inert gas.

The groups are emitted at intervals of repetition frequency of the pulse power applied to the sputtering source 15 and move along the flow of the second inert gas. At this time, the sputtered particles such as neutral atoms and ions constituting the group are bonded together in the second inert gas to generate nanoclusters of various sizes. Thus, the platinum nanoclusters as the catalyst are synthesized.

The produced platinum nanoclusters are emitted from the nanocluster extraction port 37 of the nanocluster growth cell 13 to the supporting unit 5 side below.

c) Support of Catalyst

Next, a method for supporting the platinum nanoclusters as the catalyst on the support will be described.

That is, a gas phase method (that is, dry process), which is a method for supporting the platinum nanoclusters on the support in a gas phase, will be described.

As shown in FIG. 1, first, the marimo carbon as the support is produced with the support manufacturing unit 7, and then, the second gate valve 73 is opened.

Next, the transfer rod 45 is extended to pull out the inner cylinder of the synthetic cell 51 from the inside of the pipe 61, and the inner cylinder is disposed in the synthetic cell rotary mechanism 47.

Next, the synthetic cell rotary mechanism 47 is rotated, for example, in the arrow B direction, and the marimo carbon in the inner cylinder is supplied into the rotary barrel 41. Since the axial end of the inner cylinder is provided with an opening having a diameter smaller than the outer diameter at its axial center, the marimo carbon drops from the opening and is supplied into the rotary barrel 41 when the inner cylinder is inclined.

At this time, the temperature inside the supporting unit 5 is set to a predetermined temperature in a range of 0° C. to 80° C., or for example, to 25° C. The inside of the supporting unit 5 is kept in a vacuum state similar to the inside of the nanocluster manufacturing unit 3. The rotary barrel 41 is rotating at a predetermined rotation speed in a range of 1 rpm to 100 rpm, or for example, at 20 rpm.

Since the amount of the marimo carbon manufactured in the synthetic cell 51 is known in advance through experiments and the like, the amount of the marimo carbon supplied into the rotary barrel 41 is also known.

Thereafter, the synthetic cell rotary mechanism 47 is rotated in the reverse direction, and the synthetic cell 51 in the synthetic cell rotary mechanism 47 is retracted to a predetermined retraction position (for example, in pipe 61) by the transfer rod 45.

Next, in the nanocluster manufacturing unit 3, the platinum nanoclusters are produced as described above, and the platinum nanoclusters are supplied from the nanocluster extraction port 37 into the rotary barrel 41 below.

Since the amount of the platinum nanoclusters produced by the nanocluster manufacturing unit 3 is known in advance through experiments or the like, after a desired amount of the platinum nanoclusters is supplied to the rotary barrel 41, supply of the platinum nanoclusters is stopped, for example, by stopping the operation of the nanocluster manufacturing unit 3.

The rotary barrel 41 is stopped after it is rotated for a predetermined time. Note that, since how much rotation time causes what sprinkle state (accordingly, support state) is known in advance through experiments or the like, the rotary barrel 41 is stopped when it becomes in a desired support state.

In this manner, the marimo carbon is caused to support the platinum nanoclusters. Therefore, this gives a support body in which the platinum nanoclusters are supported on the marimo carbon.

The support body is schematically shown in an enlarged manner in FIG. 5B. It is indicated that the platinum nanoclusters having similar sizes are dispersed and supported on the carbon nanofilaments (CNF) of the marimo carbon.

As schematically shown in FIG. 5C in a further enlarged manner, the carbon nanofilament of the marimo carbon has a structure in which graphene sheets are laminated in a longitudinal direction of the carbon nanofilament, and the platinum nanoclusters are attached to an end (edge) of an outer periphery of the graphene sheet. Specifically, the platinum nanocluster is attached over a plurality of edges.

d) Production of Slurry

Next, a production method for slurry will be described.

In the case of producing slurry, the inside of the supporting unit 5 is set to an anaerobic state. For example, the inside is set to the vacuum state, an Ar atmosphere, or a $N_2$ atmosphere.

As shown in FIG. 1, in order to produce slurry of the support body manufactured by the rotary barrel 41, a liquid (that is, dispersion medium) is supplied from the dispersion medium drop mechanism 49 to the rotary barrel 41, which holds the support body and is rotating. Examples of the liquid include polyethylene glycol and an ionic liquid.

The dispersion medium drop mechanism 49 need not be provided. In this case, a liquid may be supplied to the rotary barrel 41 in advance before producing the slurry.

Specifically, the opening/closing part 49c is opened, and the liquid is dropped from the tank 49a into the rotary barrel 41 through the opening 49d. The amount of the liquid to be supplied can be set according to the amount of the support body, the viscosity of the slurry to be produced, and the like.

Then, the rotary barrel 41 is stopped after it is rotated for a predetermined time. Note that, since how much rotation time causes what slurry state is known in advance through experiments or the like, the rotary barrel 41 is stopped when a desired slurry state is achieved.

Due to this, a desired slurry is obtained.

For example, an electrode of a fuel cell can be manufactured by a known method using this slurry (that is, catalyst ink).

1-3. Example

Next, an example will be described.

<Synthesis of Marimo Carbon>

The marimo carbon of the support was synthesized by a thermochemical vapor-phase deposition method of methane ($CH_4$) using 5 wt % Ni/diamond oxide as a catalyst.

Specifically, first, Ni/diamond oxide catalyst fine particles in which Ni particles were supported on the surface of diamond oxide were prepared by a wet impregnation method.

Next, the Ni/diamond oxide catalyst fine particles were contained in a flow reactor (that is, synthetic cell), and Ar purge was performed in the synthetic cell in order to remove oxygen and nitrogen in the air. Subsequently, the temperature in the synthetic cell was raised to the range from 773 K to 973 K while Ar gas was supplied at 30 mL/min. The supplied gas was changed from Ar to $CH_4$ and supplied at a speed of 30 mL/min to decompose $CH_4$ in the synthetic cell. Carbon nanofilaments (CNF) were generated by the carbon obtained by this decomposition to obtain the marimo carbon.

Each time, 50 mg of the Ni/diamond oxide catalyst fine particles were used to synthesize the marimo carbon of a total scale of 2 g by performing a plurality of times (each time for 5 hours).

The manufactured marimo carbon was contained in a glass container (diameter of 90 mmφ). Here, the manufactured marimo carbon was contained not in a rotary barrel but in a container having a magnetic stirrer.

<Gas-Phase Synthesis of Platinum Nanocluster>

The gas phase synthesis of the platinum nanoclusters was performed using the nanocluster generation apparatus described above.

The platinum nanocluster may be referred to as Pt nanocluster.

Specifically, the Pt nanoclusters were generated by a combination of a high-power nanocluster source based on high-power impulse magnetron sputtering (HiPIMS), powered by a regulated pulsed power source (Zpulser LLC, AXIA-3X), and a gas flow reactor.

Specifically, a disk-shaped Pt target (diameter 50.8 mmφ, 99.99% purity) was used as a magnetron sputtering cathode (Angstrom Sciences Inc., ONYX-MAGII) and sputtering was performed in the nanocluster growth cell cooled by liquid nitrogen.

In the vicinity of the Pt target, Ar gas (99.9995% purity) was introduced so as to increase the sputtering rate, and atomic Pt neutrals and ions were generated by magnetron sputtering including HiPIMS.

The peak power of discharge and the sputtering repetition rate were controlled to the range from 0.2 kW to 0.3 kW and 110 Hz, respectively. The generated atomic Pt species were grown into the Pt nanoclusters by buffer gas cooling with He gas (99.9998% purity).

The flow rates of the Ar gas and the He gas were controlled by individual mass flow controllers to maintain the intra-cell pressure of 5 Pa to 20 Pa. For example, the flow rates of the Ar gas and the He gas were controlled to the range of 110 sccm to 200 sccm.

The generated Pt nanocluster ions and neutrals were supplied into a vacuum chamber (that is, inside of supporting unit) in which the container was disposed, through the nanocluster extraction port, which is the lower opening (diameter 12 mmφ) of the nanocluster generation apparatus.

The vacuum chamber was evacuated at a high throughput (2300 Lis) by a turbo-molecular pump and maintained at a pressure of less than 0.1 Pa during operation.

<Deposition of Pt Nanoclusters onto Marimo Carbon>

The produced marimo carbon powder (2500 mg) was placed in a container and placed 100 mm below the opening, and the Pt nanoclusters produced by the nanocluster generation apparatus were supplied from the opening.

Then, the Pt nanoclusters were dispersed and attached (that is, sprinkled) to the surface of the marimo carbon while gently mixing the Pt nanoclusters and the marimo carbon powder (rotation speed: 80 rpm to 90 rpm) using a magnetic stirrer.

Such mixing treatment was performed for 50 hours, and then a support body (that is, PtNC-MC powder) in which the Pt nanoclusters were attached to the surface of the marimo carbon was obtained.

1-4. Effects

In the first embodiment, following effects can be obtained.

In the present first embodiment, in the gas phase, using the rotary barrel 41, a multitude of pieces of marimo carbon are rolled, and each of the pieces of marimo carbon was sprinkled with a multitude of Pt nanoclusters, whereby a multitude of Pt nanoclusters having uniform sizes can be appropriately dispersed and supported on the surface of the carbon nanofilaments of the marimo carbon.

Specifically, by manufacturing the support body by the above-described manufacturing apparatus 1 for the support body, it is possible to easily set, to a desired state, the state of size of the Pt nanocluster to be supported on the marimo carbon. For example, it is possible to cause the Pt nanoclusters of uniform dimensions (sizes) to be supported. The Pt nanoclusters can be almost uniformly distributed and supported on the surface of the marimo carbon.

When the support body thus manufactured is applied to, for example, a support body catalyst of a fuel cell, performance of the fuel cell is greatly improved by, for example, atomization of the catalyst and the like. Since the catalyst can be easily atomized, the amount of, for example, platinum used for the catalyst can be reduced.

Furthermore, as compared with a case where the Pt nanoclusters are supported on the marimo carbon in the liquid phase, there is an advantage that the catalytic activity is less likely to decrease because a ligand used for suppressing aggregation of the Pt nanoclusters does not remain. Since the Pt nanoclusters and the marimo carbon are directly bonded, dispersibility of the Pt nanoclusters is maintained, and therefore there is an advantage that the catalytic activity is less likely to decrease.

2. SECOND EMBODIMENT

Since the basic configuration of a second embodiment is similar to that of the first embodiment, differences from the first embodiment will be mainly described below. Note that the same reference numerals as those in the first embodiment indicate the same configuration, and reference is made to preceding descriptions.

The present second embodiment is different from the first embodiment mainly in a configuration for manufacturing a support body, and thus different points will be mainly described.

2-1. Manufacturing Apparatus

Figure 6:
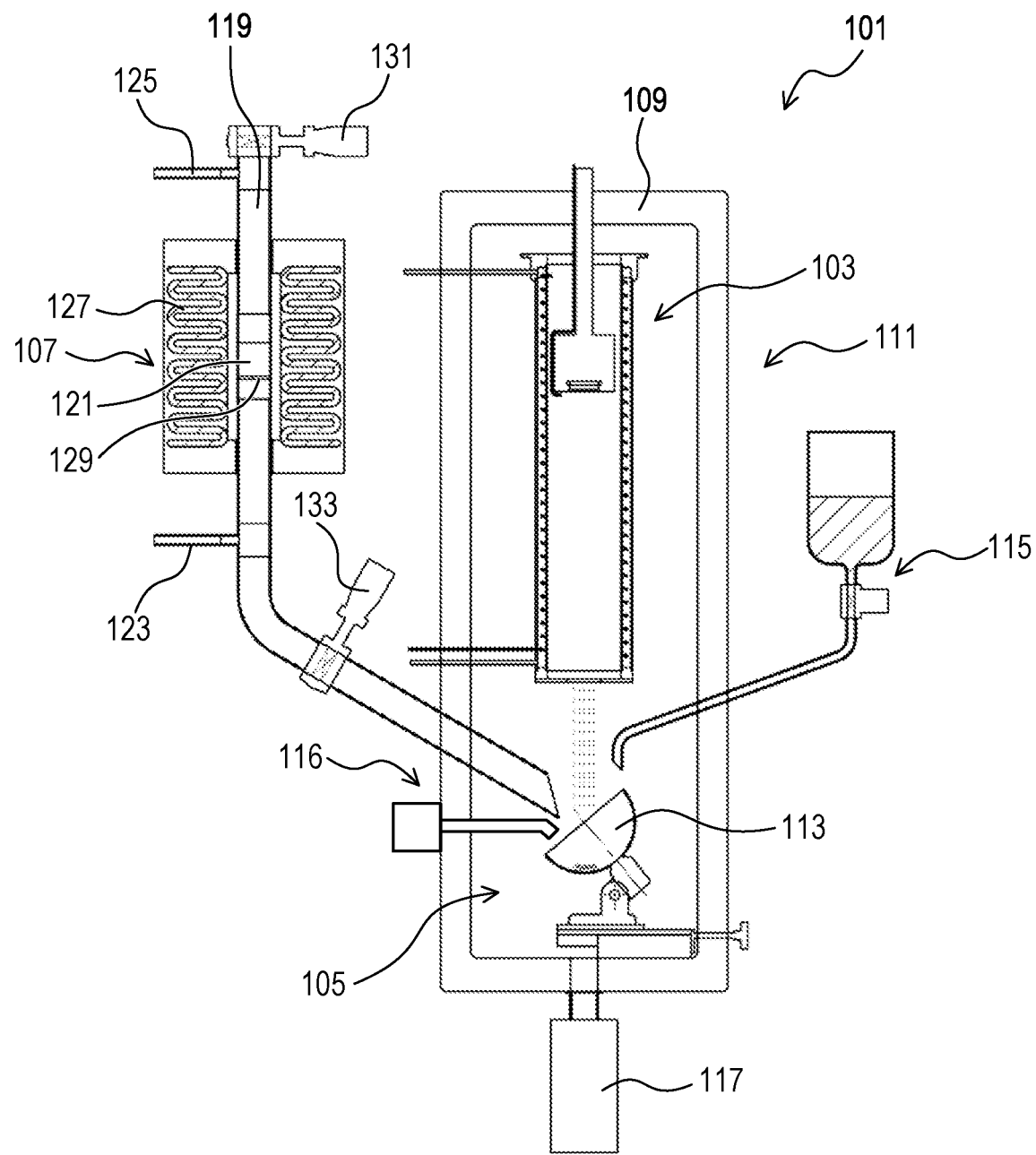
FIG. 6 is an explanatory view showing a manufacturing apparatus for a support body of a second embodiment.
Figure 7A:
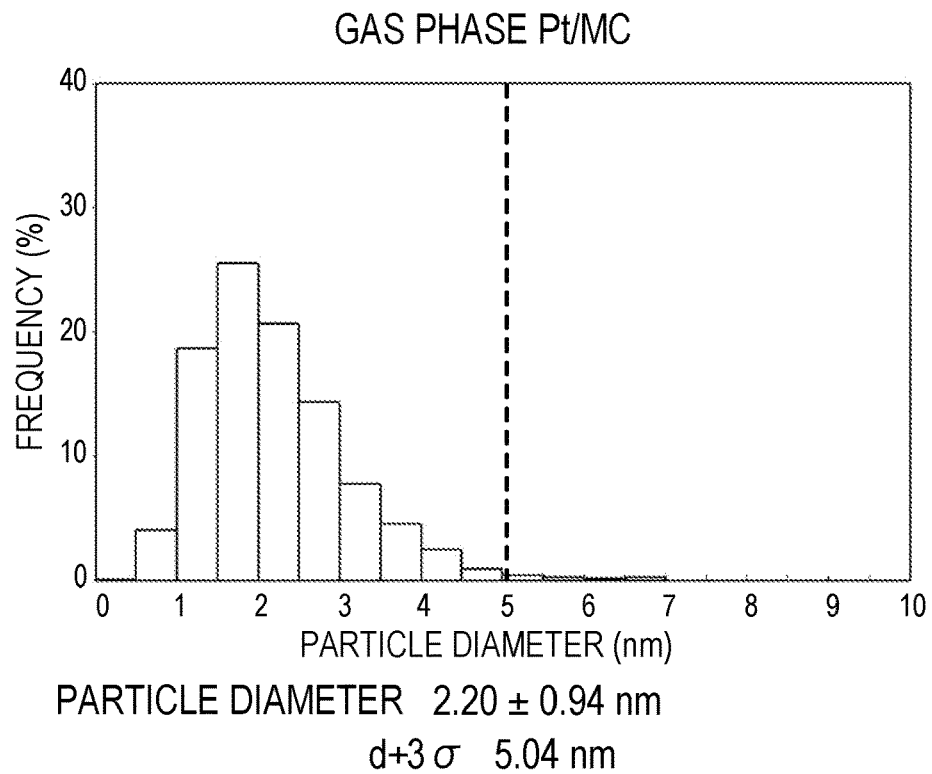
FIG. 7A is a graph showing distribution of a particle size of platinum (Pt) nanoclusters supported on marimo carbon in a gas phase.
Figure 7B:
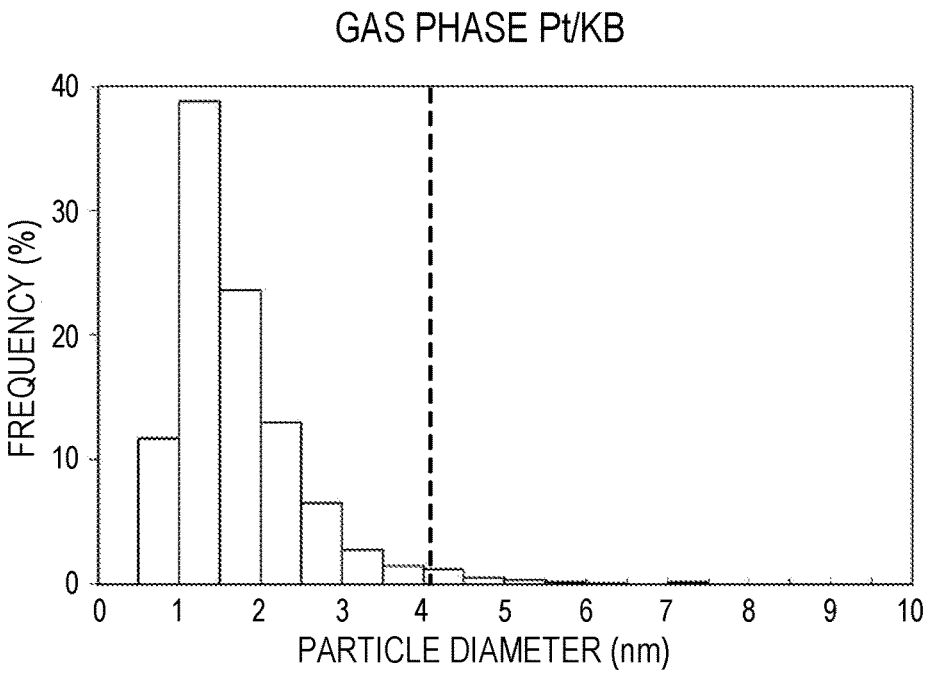
FIG. 7B is a graph showing distribution of a particle size of platinum (Pt) nanoclusters supported on carbon black in a gas phase.
Figure 8A:
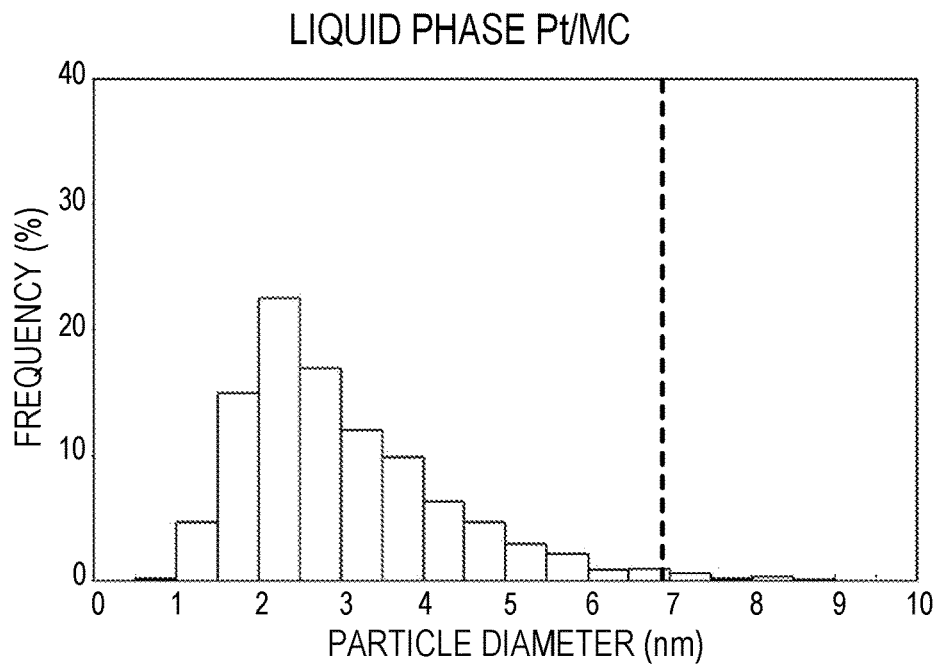
FIG. 8A is a graph showing distribution of a particle size of platinum (Pt) nanoclusters supported on marimo carbon in a liquid phase.
Figure 8B:
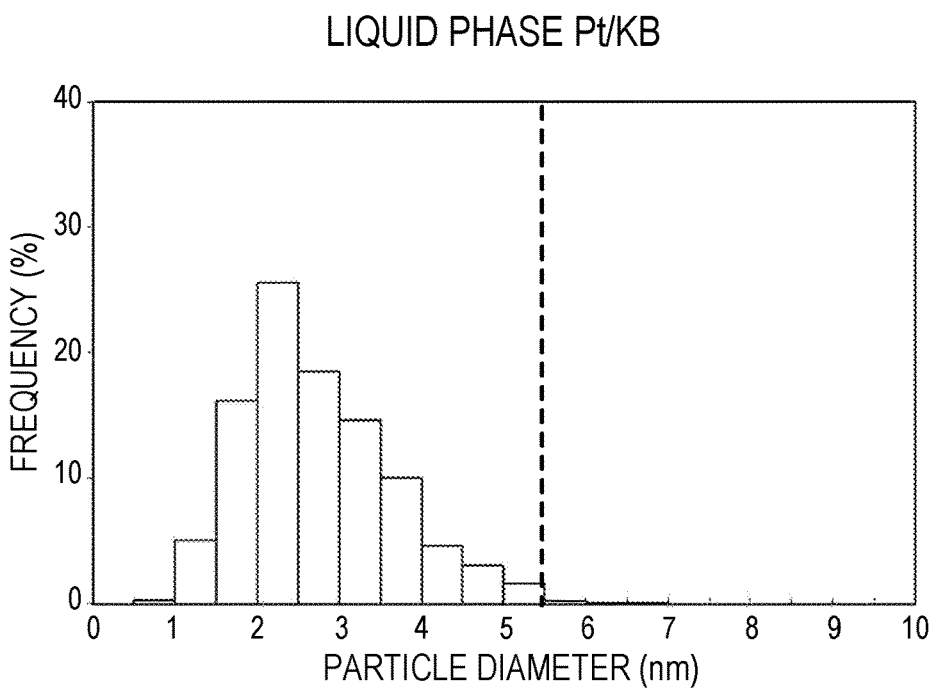
FIG. 8B is a graph showing distribution of a particle size of platinum (Pt) nanoclusters supported on carbon black in a liquid phase.

As shown in FIG. 6, a manufacturing apparatus 101 for the support body of the present second embodiment is an apparatus that integrally includes a nanocluster manufacturing unit 103 that produces a Pt nanoclusters as a catalyst in a gas phase, a supporting unit 105 that causes marimo carbon as a support to support the nanoclusters in a gas phase, and a support manufacturing unit 107 that produces a support in a gas phase.

Since the nanocluster manufacturing unit 103 and the supporting unit 105 are integrally configured with a tubular vacuum container 109 as a common configuration, the nanocluster manufacturing unit 103 and the supporting unit 105 are referred to as a composite device 111.

Among them, the composite device 111 including the nanocluster manufacturing unit 103 and the supporting unit 105 is similar to that of the first embodiment, and thus its description will be simplified.

That is, in the second embodiment, as in the first embodiment, a rotary barrel 113 and the like are provided below the nanocluster manufacturing unit 103, and a dispersion medium drop mechanism 115 that supplies a liquid to the rotary barrel 113, an activation mechanism 116 that activates the marimo carbon, an ion detection device 117 that detects the nanoclusters, and the like are further provided.

In particular, in the present second embodiment, the configuration of the support manufacturing unit 107 is different from that of the first embodiment, and the marimo carbon as the support is produced using a fluidized bed.

The support manufacturing unit 107 has a configuration similar to that of the apparatus described in Patent Document 3, for example.

Specifically, in the present second embodiment, the support manufacturing unit 107 includes a pipe 119 extending in the up-down direction and having a lower end inserted into the supporting unit 105, a reaction tank 121 provided in the pipe 119 and containing diamond catalyst fine particles, a gas supply unit 123 that is provided in a lower part of the reaction tank 121 and that introduces a gas composed of hydrocarbon, a gas discharge unit 125 that is provided in an upper part of the reaction tank 121 and that discharges a gas, a heater 127 provided to surround the reaction tank 121, and a filter 129 that does not allow the diamond catalyst fine particles to pass through but allows the gas to pass through.

In the pipe 119, a first gate valve 131 that opens/closes the pipe 119 is disposed above the gas supply unit 123, and a second gate valve 133 that opens/closes the pipe 119 is disposed below the gas discharge unit 125.

A reaction assist gas or a dilution gas may be mixed with a gas made of the hydrocarbon.

2-2. Manufacturing Method

Manufacturing of the marimo carbon using the support manufacturing unit 107 is performed as follows.

Diamond catalyst fine particles in which a transition metal catalyst is supported on the surfaces of the diamond fine particles whose surfaces are oxidized are disposed on the filter 129.

Next, in a state where the first and second gate valves 131 and 133 are closed, a gas composed of the hydrocarbon is introduced from the gas supply unit 123 at a predetermined flow rate, and is discharged from the gas discharge unit 125.

The predetermined flow rate of the gas is a flow rate at which the diamond catalyst fine particles float and are stirred in the reaction tank 121. If the reaction tank 121 is made of fused quartz, the flow rate is set by confirming the state with the naked eye.

For example, it is preferable that the flow rate is such that the diamond catalyst fine particles do not flow out from the gas discharge unit 125 by floating and being stirred in the reaction tank 121.

The particle diameter of the diamond catalyst fine particles may be 500 nm or less, and a too large particle diameter makes the diamond catalyst fine particles difficult to float. The temperature is preferably in the range of 400° C. to 600° C. when Ni, Cr, or Pd is used as a catalyst and methane is used as a hydrocarbon gas. Since the particle diameter of the generated marimo carbon increases in proportion to the time for floating and stirring at a predetermined temperature, the reaction time may be set according to the purpose of use.

When Ni or Co is selected as the transition metal, the nanocarbon material constituting the marimo carbon is a carbon nanofilament (CNF), and when Pd is selected, the nanocarbon material constituting the marimo carbon is a coin-laminated carbon nanographite, and therefore the transition metal may be selected according to the purpose of use.

In this method, since the diamond catalyst fine particles float and are stirred in the reaction tank 121, the catalytic reaction uniformly occurs over the entire surfaces of the diamond catalyst fine particles, and as a result, the nanocarbon material having a uniform length radially grows over the entire surfaces of the diamond catalyst fine particles, and marimo-like fine particles are obtained.

Next, when the marimo carbon is manufactured in the support manufacturing unit 107, the second gate valve 133 may be opened to supply the marimo carbon into the rotary barrel 113 from the tip end of the pipe 119.

Since the amount of the marimo carbon manufactured in the reaction tank 121 is known in advance, the amount of marimo carbon to be supplied to the rotary barrel 113 can also be set.

The present second embodiment achieves the same effect as that of the first embodiment. Moreover, in the present second embodiment, since the marimo carbon is manufactured using the fluidized bed, as described above, there is a remarkable effect that the marimo-like fine particles in which the nanocarbon material having the uniform length radially grows over the entire surfaces of the diamond catalyst fine particles is obtained.

3. EXPERIMENT EXAMPLE 1

(EXPERIMENT EXAMPLE FOR EXAMINING SIZE)

First, various support bodies used in the experiment were manufactured by the same manufacturing method as in the above example.

Specifically, a support body A (gas phase Pt/MC (4.5 wt %)) that is marimo carbon caused to support 4.5 wt % of platinum particles (that is, Pt nanoclusters) constituting a platinum catalyst was produced. The particle diameter of the marimo carbon is 50 µm to 100 µm, and the diameter of the fibrous carbon nanofilament constituting the marimo carbon is 10 nm to 100 nm.

Apart from this, using the composite device, carbon black (for example, commercially available Ketjen black) was disposed in the rotary barrel to produce a support body B (gas phase Pt/KB) that is carbon black caused to support 8.4 wt % of Pt nanoclusters. The particle diameter of the carbon black is 3 nm to 500 nm.

Furthermore, as a comparative example, a support body C (liquid phase Pt/MC) in which 9.1 wt % of Pt nanoclusters are supported on the marimo carbon in a liquid phase was produced by a conventional method such as an impregnation method or a chemical reduction method, for example. The particle diameter of the marimo carbon is 50 µm to 100 µm, and the diameter of the fibrous carbon nanofilament constituting the marimo carbon is 10 nm to 100 nm.

Similarly, a support body D (liquid phase Pt/KB) in which 8.3 wt % of Pt nanoclusters were supported on carbon black (for example, Ketjen black) in a liquid phase was produced. The particle diameter of the carbon black is 3 nm to 500 nm.

Next, each of the support bodies A to D was photographed using a transmission electron microscope (TEM) to obtain an image of a support body in which a multitude of Pt nanoclusters were supported on each support. The magnification was about 100000 times.

Using this image, a multitude (for example, 1500) of Pt nanoclusters were randomly selected in each of the support bodies A to D, and the sizes of the Pt nanoclusters were obtained.

Then, the Pt nanoclusters were divided for each size to produce histograms shown in FIGS. 7A, 7B, 8A, and 8B. In each figure, the vertical axis indicates the ratio of the number of the Pt nanoclusters, and the horizontal axis indicates the size of the Pt nanoclusters. In each figure, the number after the particle diameter indicates "average particle diameter (d)±standard deviation (σ)". d+3σ indicates an upper limit of a section of about 99.7% of the entirety. The average particle diameter is an average value of particle diameters of the Pt nanoclusters.

FIG. 7A, FIG. 7B, FIG. 8A, and FIG. 8B indicate that the size of the Pt nanocluster becomes smaller when the Pt nanocluster is produced in the gas phase rather than in the liquid phase. That is, it is indicated that in the support bodies A and B of the present disclosure, the particle growth and aggregation of the Pt nanoclusters were suppressed as compared with the support bodies C and D of the comparative example.

4. EXPERIMENT EXAMPLE 2

(EXPERIMENT EXAMPLE FOR EXAMINING OBLATENESS)

In the present experiment example 2, the support bodies A to D of the experiment example 1 were used.

Then, similarly to the experiment example 1, each of the support bodies A to D was photographed using a transmission electron microscope (TEM) to obtain an image of a support body in which a multitude of Pt nanoclusters were supported on each support. The magnification was about 100000 times.

Figure 9C:
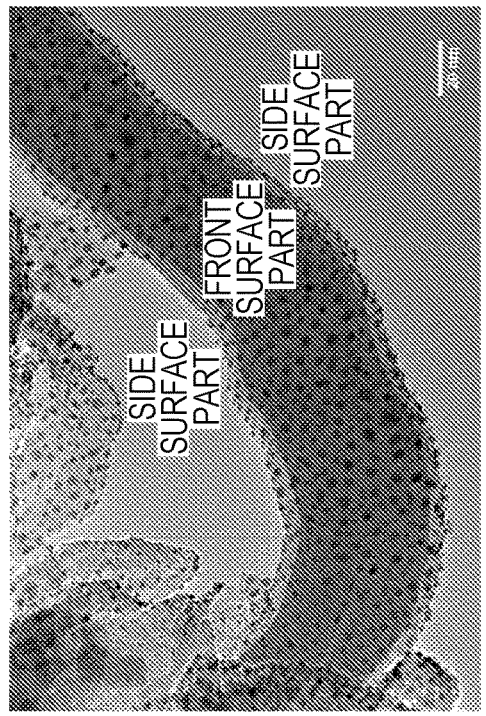
FIG. 9C is an explanatory view showing an image obtained by photographing the support body (for example, CNF) with a transmission electron microscope.
Figure 9A:
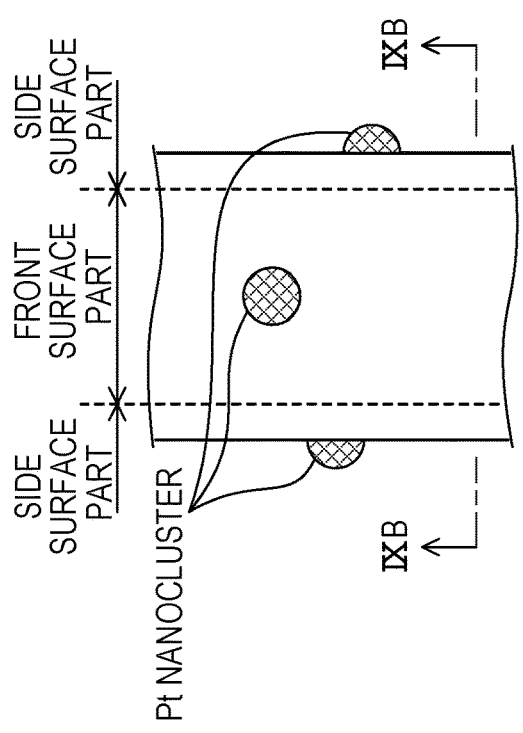
FIG. 9A is an explanatory view (plan view) schematically showing a plane of a support body in which Pt nanoclusters are supported on a support (for example, CNF).
Figure 9B:
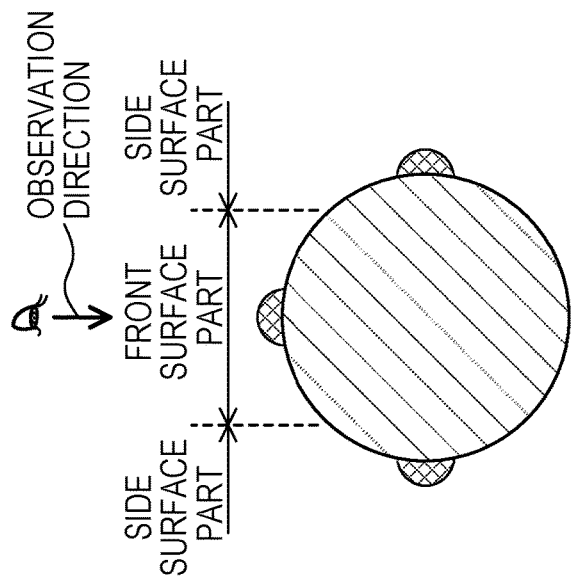
FIG. 9B is an explanatory view (cross-sectional view taken along line IXB-IXB of FIG. 9A) showing a cross section of the support body (for example, CNF) broken perpendicularly to a direction in which the support body extends.
Figure 10A:
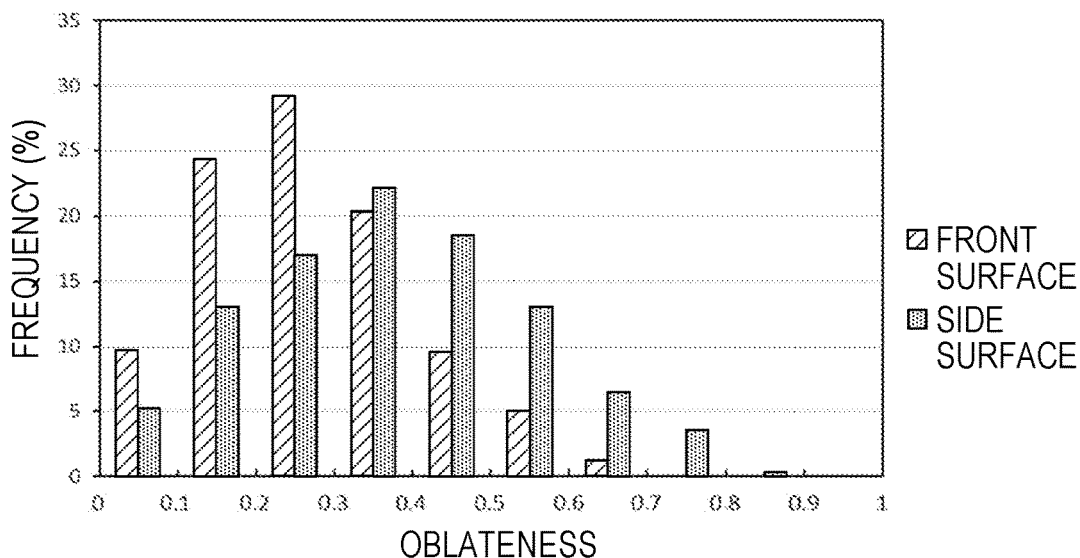
FIG. 10A is a graph showing distribution of oblateness of Pt nanoclusters supported on marimo carbon in a gas phase.
Figure 10B:
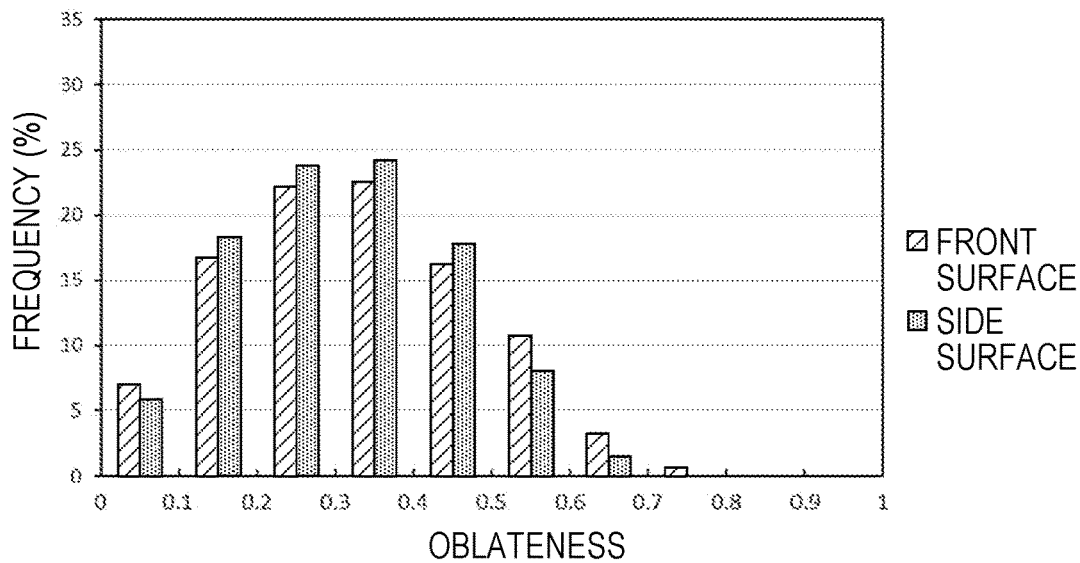
FIG. 10B is a graph showing distribution of oblateness of Pt nanoclusters supported on carbon black in a gas phase.
Figure 11A:
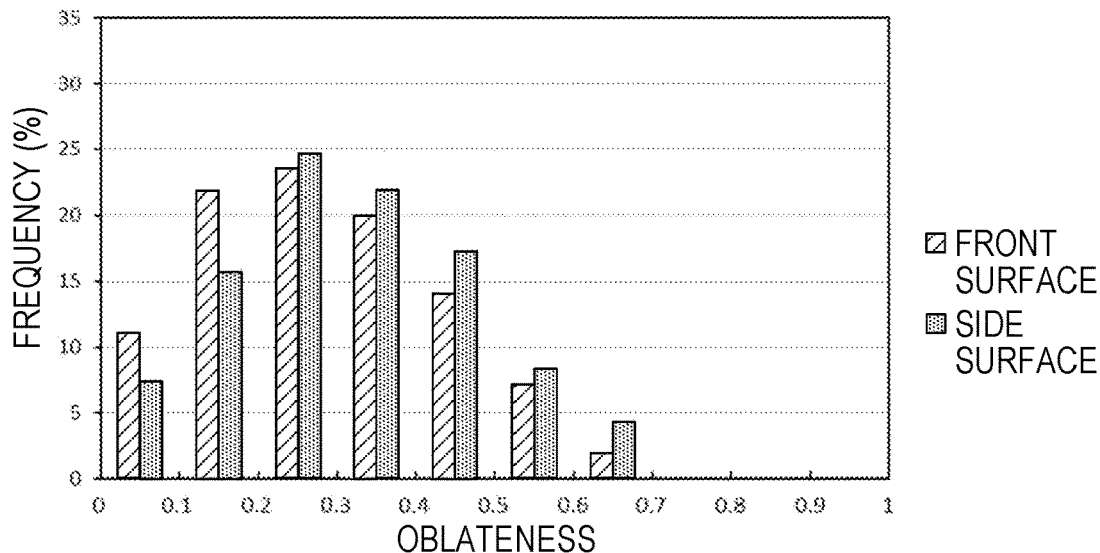
FIG. 11A is a graph showing distribution of oblateness of Pt nanoclusters supported on marimo carbon in a liquid phase.
Figure 11B:
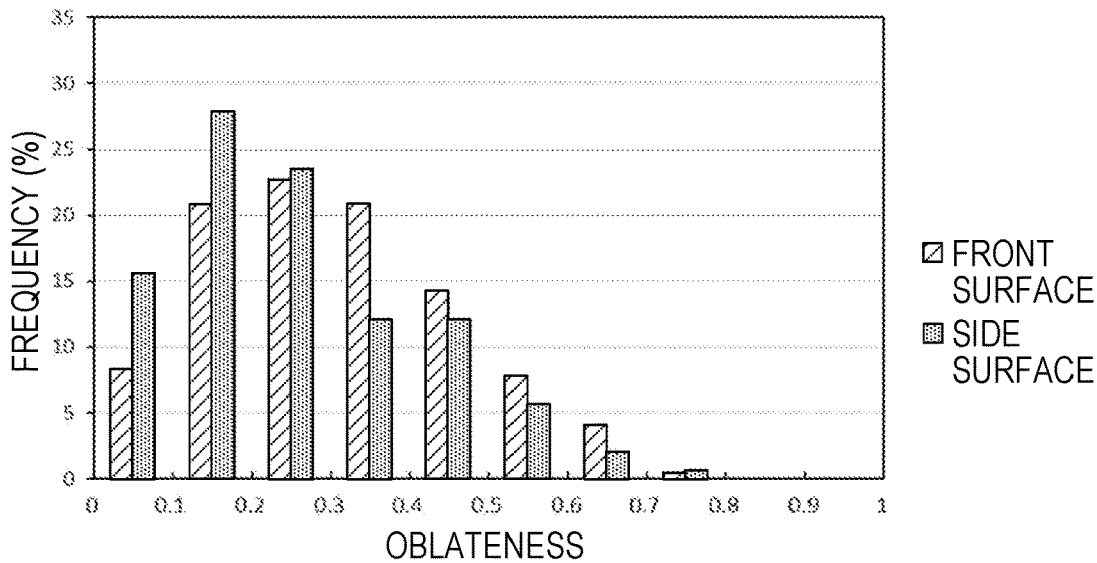
FIG. 11B is a graph showing distribution of oblateness of Pt nanoclusters supported on carbon black in a liquid phase.

Using this image, in each of the support bodies A to D, the oblateness was obtained for a multitude (for example, total of 1500 with 1300 for front surface part and 200 for side surface part) of Pt nanoclusters on a front surface part and a side surface part shown in FIGS. 9A to 9C.

The "front surface part" indicates an inner range in the support body plan view (that is, view as viewed in observation direction of support body) shown in FIG. 9A, for example, and the "side surface part" indicates an outer range (that is, outer peripheral side relative to front surface part) in the support body plan view. That is, the Pt nanoclusters on the front surface part are supported on the front surface part of the support, and the Pt nanoclusters on the side surface part are supported on the side surface part of the support.

Note that the observation direction is a direction perpendicular to the image of the electron microscope, and in FIG. 9B, a direction (up-down direction of FIG. 9B) perpendicular to a direction (axial direction perpendicular to the paper surface) in which the CNF of marimo carbon extends.

The oblateness is (maximum diameter minimum diameter)/maximum diameter.

Then, the Pt nanoclusters were divided for each oblateness to produce histograms shown in FIGS. 10A, 10B, 11A, and 11B. In FIGS. 10A, 10B, 11A, and 11B, the vertical axis indicates the ratio of the number of the Pt nanoclusters, and the horizontal axis indicates the oblateness.

In FIGS. 10A, 10B, 11A, and 11B, the inside of the support body is divided into two regions (that is, front surface part and side surface part) as shown in FIGS. 9A to 9C, and the oblateness in the front surface part is indicated by "oblateness (front surface)" and the oblateness in the side surface part is indicated by "oblateness (side surface)". At this time, the "oblateness (side surface)" indicates a crushing degree in the thickness direction (that is, height direction from surface of support) with respect to the length of the particle (that is, Pt nanocluster) in the support surface direction (that is, direction along surface), and the "oblateness (front surface)" is based on the major axis and the minor axis of the particle in the support surface direction.

In the present experiment example 2, in the image of the transmission electron microscope, the two regions were divided with a region from the outermost part (that is, outer peripheral part) of the support to the inside of about 2.5 times (for example, 2 times) the average particle diameter of the particle (that is, Pt nanocluster) as the side surface part, and with a region further inside as the front surface part (see FIGS. 9A, 9B, and 9C). Here, the average particle diameter is obtained from the image of the Pt nanoclusters themselves in the image of the transmission electron microscope. The Pt nanoclusters positioned on a boundary between the front surface part and the side surface part were measured as inside. The boundary between the front surface part and the side surface part in FIG. 9C indicates a schematic position. In FIG. 9C, the front surface part is indicated in darker gray than the side surface part.

In FIGS. 10A, 10B, 11A, and 11B, the number after the oblateness indicates "average value (d)±standard deviation (σ)".

FIGS. 10A, 10B, 11A, and 11B indicate that the Pt nanoclusters supported on the marimo carbon in the gas phase have a size in the thickness direction smaller than that in the support surface direction compared with the Pt nanoclusters in the other support bodies. That is, it is found that in the support body A of the present disclosure, the thickness of the platinum catalyst becomes thinner than that of other support bodies, and it can be more firmly attached.

5. EXPERIMENT EXAMPLE 3

(EXPERIMENT EXAMPLE FOR EXAMINING OF EDGE NUMBER)

In the present experiment example 3, the support bodies A and C of the experiment example 1 were used.

Then, similarly to the experiment example 1, the support bodies A and C were photographed using a transmission electron microscope (TEM) to obtain an image of a support body in which a multitude of Pt nanoclusters were supported on each support. The magnification was about 100000 times.

Using this image, it was obtained, in each of the support bodies A and C, the number of the edges (that is, edge number) of the graphene sheet, over which a multitude (for example, 100 in range of 100 to 500) of randomly selected Pt nanoclusters each span and were attached, was examined.

Figure 12:
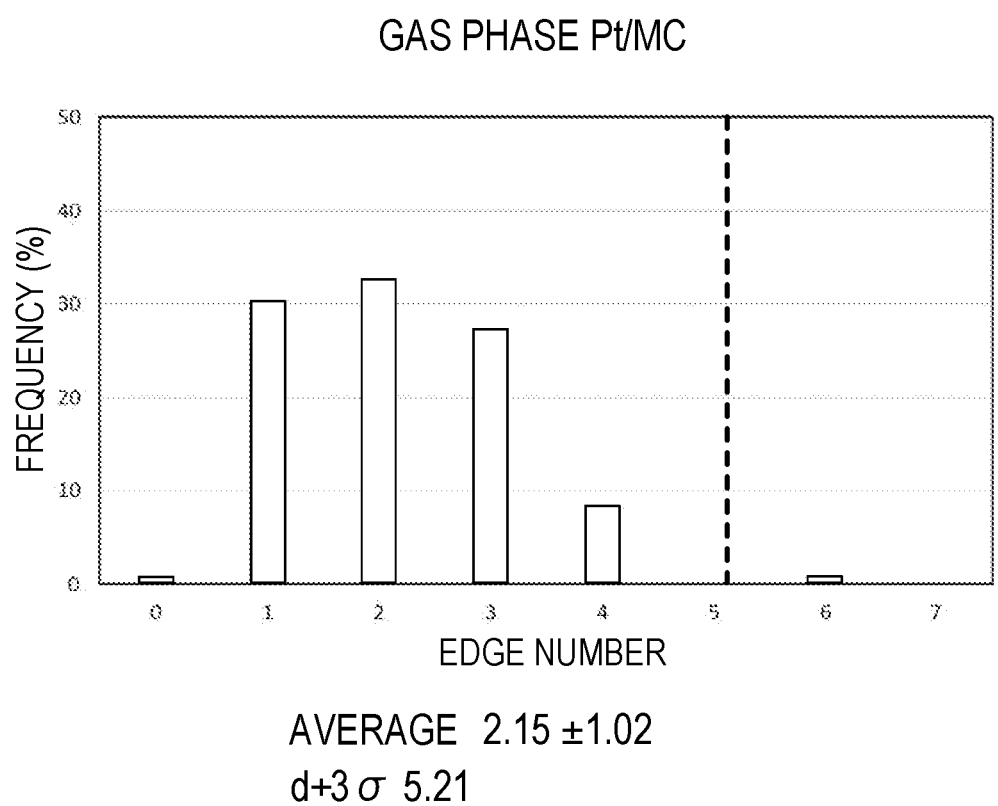
FIG. 12 is a graph showing distribution of the number of edges (edge number) of a graphene sheet with which a Pt nanocluster is in contact in marimo carbon supporting the Pt nanoclusters in a gas phase.
Figure 13:
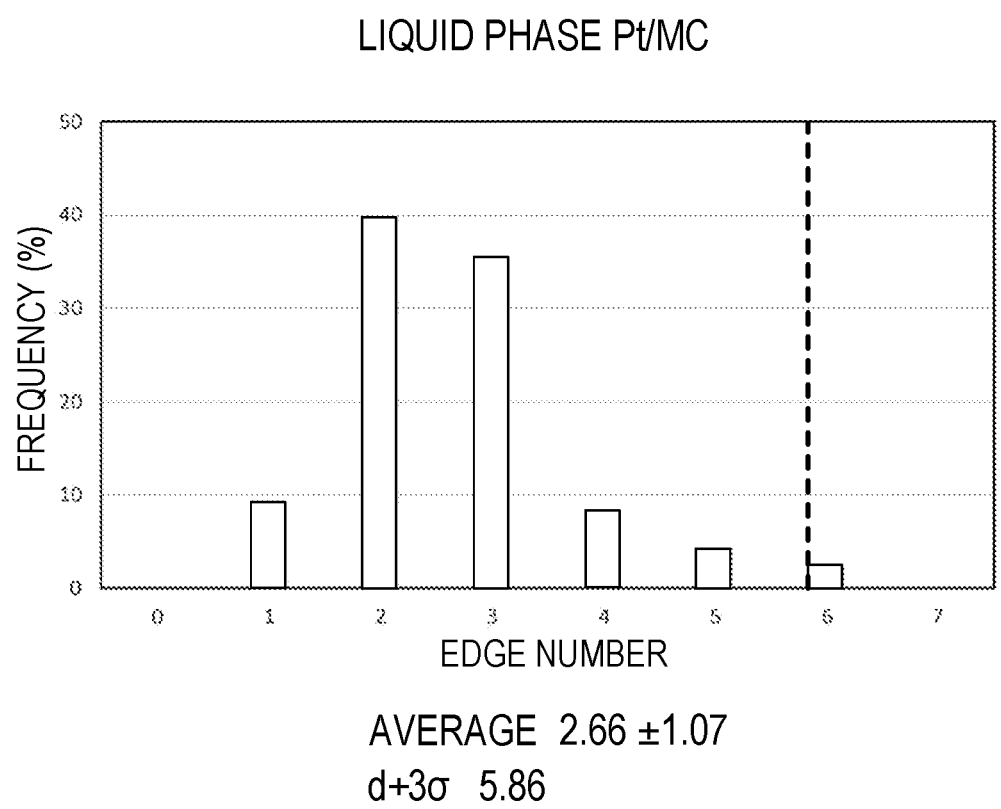
FIG. 13 is a graph showing distribution of the number of edges of a graphene sheet with which a Pt nanocluster is in contact in marimo carbon supporting the Pt nanoclusters in a liquid phase.

Then, the Pt nanoclusters were divided for each edge number to produce histograms shown in FIGS. 12 and 13. In each figure, the vertical axis indicates the ratio of the number of the Pt nanoclusters, and the horizontal axis indicates the edge number.

In FIGS. 12 and 13, the number after the average indicates "average value (d)±standard deviation (σ) of edge number".

FIGS. 12 and 13 indicate that the number of spanned edges is smaller when the Pt nanoclusters are produced in the gas phase than in the liquid phase. That is, since the support body A of the present disclosure has a smaller size distribution of the Pt nanoclusters than that of the support body C of the comparative example, it is found that the number of spanned edges has a correlation also with the size distribution.

6. EXPERIMENT EXAMPLE 4

(EXPERIMENT EXAMPLE FOR EFFECT OF CATALYST)

In the present experiment example 4, an effect of using a support body manufactured by the manufacturing method of the present disclosure in a fuel cell is examined.
<Production of Membrane Electrode Assembly>

In order to produce MEA used when cell performance of a fuel cell is measured, first, Pt nanoclusters (as catalyst) supported on the marimo carbon were produced by the same method as in the above example. The MEA is an abbreviation for a membrane electrode assembly.

Specifically, a support body E, which is the marimo carbon (gas phase Pt/MC (8.4 wt %)) caused to support 8.4 wt % of the catalyst, was produced.

Apart from this, similarly to the experiment example 1, using the composite device, a support body F (gas phase Pt/KB (8.5 wt %)) caused to support 8.5 wt % of the catalyst was produced using a carbon nanomaterial of commercially available Ketjen black as a support for supporting the Pt nanoclusters.

Specifically, in order to produce a catalyst ink, the support bodies E and F were suspended in water, and different amounts of diluted ionomer (5 wt % Nafion) solution were added to produce different ionomer/carbon weight ratios (I/C) of Nafion and the support bodies E and F.

As a comparative example, similarly to the experiment example 1, a support body G (liquid phase Pt/MC) in which 6.1 wt % of the Pt nanoclusters were supported on the marimo carbon in the liquid phase and a support body H (liquid phase Pt/KB) in which 8.7 wt % of the Pt nanoclusters were supported on the carbon black (for example, Ketjen black) in the liquid phase were produced, and catalyst inks were produced similarly to described above using the support bodies G and H.

Each of the catalyst inks was sprayed onto both sides of a solid electrolyte membrane (NRE212, DuPont) having an area of 80 mm×80 mm to form a CCM having an area of 50 mm×50 mm. The CCM is an abbreviation for a catalyst coated membrane.

Each CCM was then hot-pressed appropriately (46 kg/cm$^2$, 155° C., 5 mins).

Figure 14:
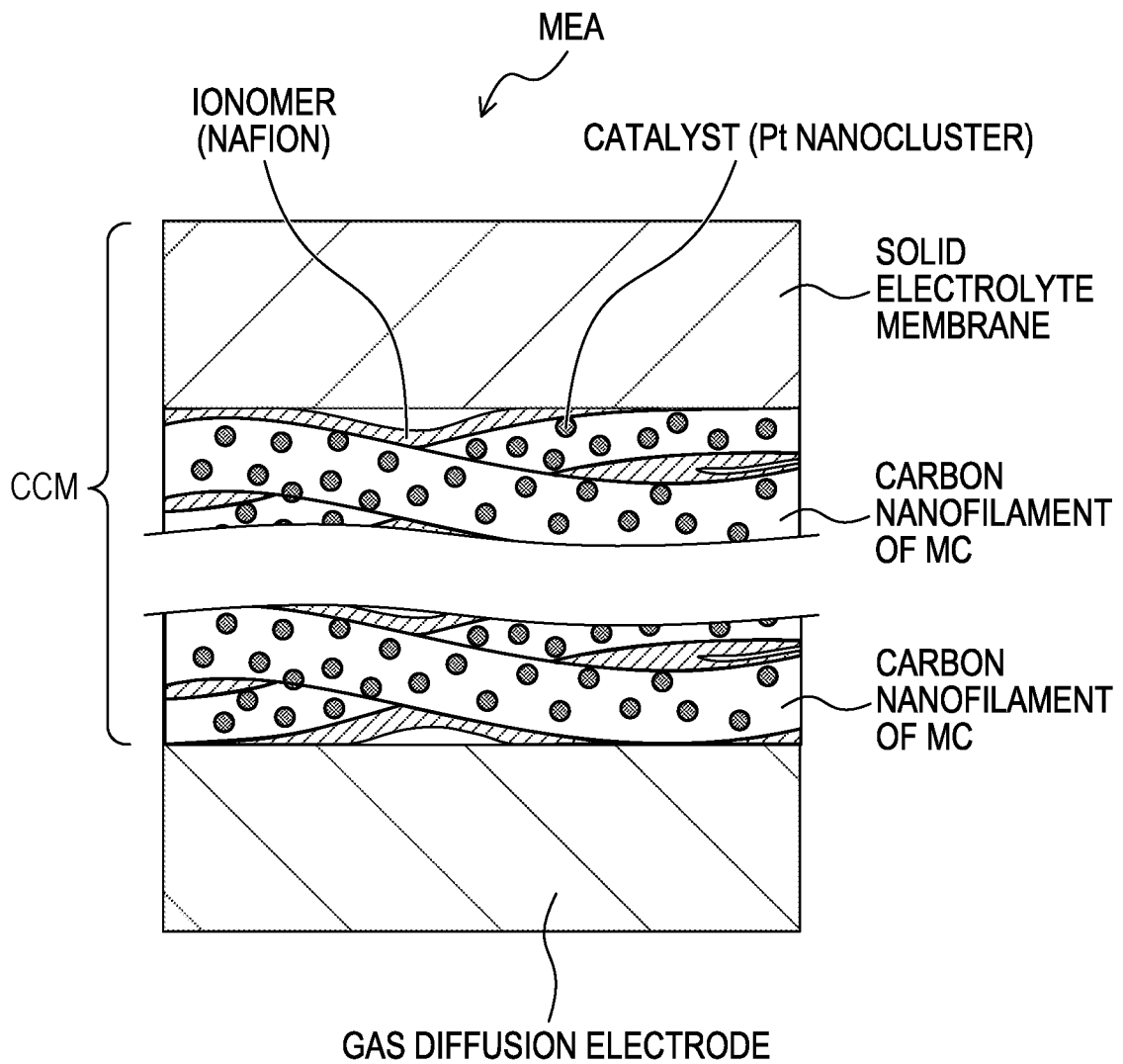
FIG. 14 is an explanatory view showing a part of a sample used in an experiment example 4.

In the end, each CCM was brought into contact with a commercially available gas diffusion electrode to produce a MEA as described in FIG. 14. FIG. 14 shows a configuration on one side in the thickness direction of the MEA, but both sides have the similar configurations actually. That is, one side in the thickness direction of the MEA includes a cathode, and the other side includes an anode.
<Cell Performance Measurement for PEFC>

Next, a method for evaluating cell performance of a fuel cell using the MEA produced as described above will be described. Here, a polymer electrolyte fuel cell (PEFC) will be described as a fuel cell.

As a cell of the fuel cell used for evaluation, a cell including an MEA having the structure shown in FIG. 14 was used. A support body supporting a catalyst as shown in FIG. 14 was disposed on the anode and the cathode of the cell. Table 1 below shows the support body used for the anode and the cathode. Table 1 also shows the relationship between the support bodies and the symbols in the graphs of FIGS. 15A to 15C.

TABLE 1

| Symbol | Anode | Cathode | Remarks |
|---|---|---|---|
| ○ | Gas phase Pt/MC (8.4 wt %) | Gas phase Pt/MC (8.4 wt %) | Support body E |
| Δ | Gas phase Pt/KB (8.5 wt %) | Gas phase Pt/KB (8.5 wt %) | Support body F |
| □ | Liquid phase Pt/MC (6.1 wt %) | Liquid phase Pt/MC (6.1 wt %) | Support body G |
| x | Liquid phase Pt/KB (8.7 wt %) | Liquid phase Pt/KB (8.7 wt %) | Support body H |

Then, I-V measurement and I-W measurement were conducted on each sample (that is, cell of fuel cell) used for evaluation.

Specifically, I-V measurement and I-W measurement were conducted at a cell temperature of 80° C. The anode of the cell was supplied with humidified hydrogen gas (200 mLmin$^{-1}$, 100% RH at 80° C.) and the cathode of the cell was supplied with humidified air (200 mLmin$^{-1}$, 100% RH at 70° C.).

Figure 15A:
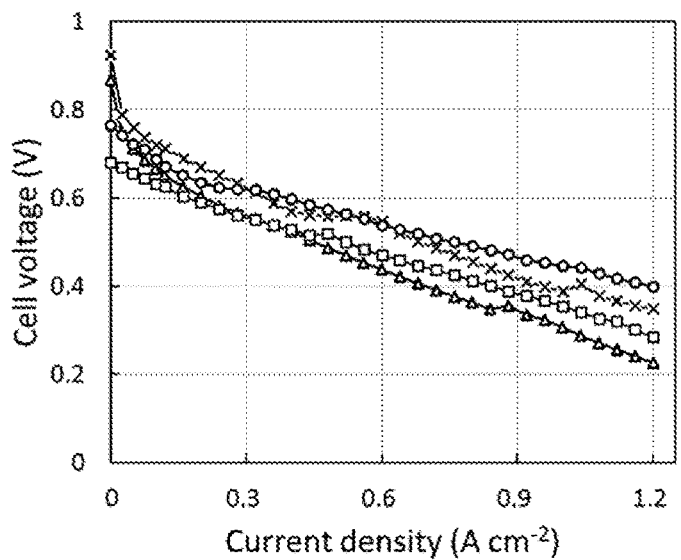
FIG. 15A shows an experimental result of an experiment example 4, specifically, a graph showing a relationship between a current density and a cell voltage in a fuel cell.
Figure 15B:
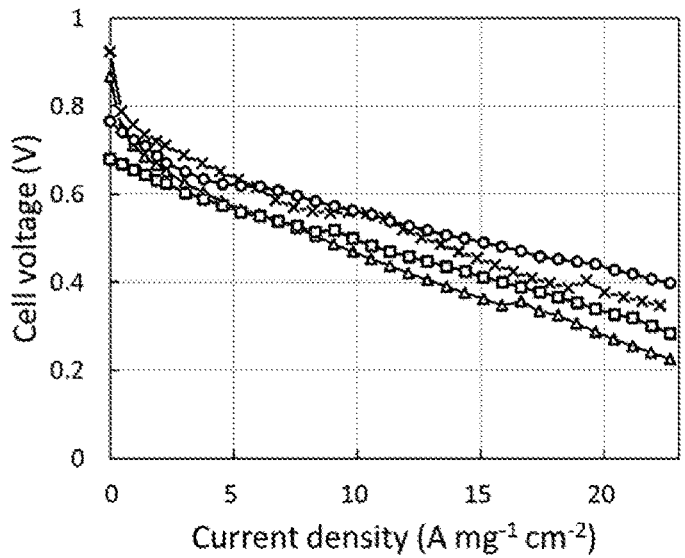
FIG. 15B shows an experimental result of an experiment example 4, specifically, a graph showing a relationship between a current density and a cell voltage in a fuel cell.

Then, the relationship between the density (current density) of the current flowing between the anode and the cathode and the voltage (cell voltage) between the anode and the cathode at that time were examined. The results are shown in FIGS. 15A and 15B. FIGS. 15A and 15B show the results of conducting the experiment twice on the same sample.

FIGS. 15A and 15B indicate that the cell voltage of the support body E became the highest in the high current density region. That is, it is found that the support body of the present disclosure has excellent performance.

Figure 15C:
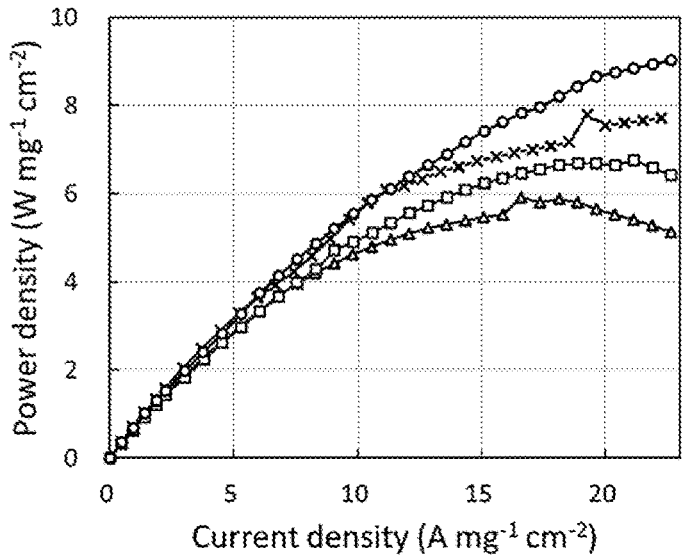
FIG. 15C shows an experimental result of an experiment example 4, specifically, a graph showing a relationship between a current density and a power density in a fuel cell.

Similarly, the result of examination on the relationship between the current density and the power density of the cell is shown in FIG. 15C.

FIG. 15C indicates that the power output density of the support body E became the highest in the high current density region. That is, it is found that the support body of the present disclosure has excellent performance.

7. OTHER EMBODIMENTS

Although embodiments of the present disclosure have been described above, the present disclosure is not limited to the above-described embodiments, and can be implemented in various modifications.

(7a) As a material of the nanoclusters supported on the support, various materials can be adopted in addition to platinum.

Examples include a substance that functions as a catalyst for a fuel cell or the like.

Examples of the metal include noble metals such as platinum, transition metals such as cobalt, and typical metals such as magnesium. Examples include platinum group metals such as Pt, Ru, Rh, Pd, and Ir, and transition metals such as Cu, Fe, Ni, Co, V, and Mn.

Examples of the alloy include alloys of a noble metal and a transition metal such as platinum-cobalt and alloys of a noble metal and a typical metal such as platinum-magnesium. Examples include alloys by combination of platinum and a platinum group such as Pt—Co, Pt—Ru, Pt—Rh, Pt—Pd, and Pt—Ir, combination of platinum and a transition metal such as Pt—Cu, Pt—Ni, and Pt—Co, and combination of a platinum group and a transition metal such as Pd—Ni.

Examples of the compound include compounds such as carbon-nitrogen and silicon-carbon. Examples include metal-chalcogenide compounds such as FeSe and $Cu_2(Ge, Sn)S_3$.

(7b) The support is not limited to the marimo carbon or the carbon black, and various supports can be adopted. For example, carbon nanotubes or glassy carbon can be adopted.

(7c) Examples of the substance constituting the support include carbon, an oxide, a nitride, a carbide, and a sulfide. Examples include alumina, titanium oxide, silica, magnesia, silicon carbide, titanium oxynitride, and strontium titanate.

Examples of the oxide include metal oxides such as iron oxide. Examples include transition metal oxides such as $TiO_2$, TiO, $ZrO_2$, and ZrO, Li-transition metal oxides such as $LiFeO_2$, $Li_3MnO_3$, and $LiCoO_2$, SiO, and $SiO_2$.

Examples of the nitride include metal nitrides such as iron nitride. Examples include $Li_3N$, $Li_7MnN_4$, $Li_3FeN_2$, and Li-transition metal nitrides.

Examples of the carbide include WC and MoC.

Examples of the sulfide include $Li_2S$, $MoS_2Li_{10}$, $GeP_2S_{12}$, and $Li_7P_3S_{11}$.

(7d) The support body in which the catalyst is supported on the support can be used for, for example, a gas sensor, an exhaust gas catalyst, manufacturing of a chemical synthetic product, and the like, in addition to the fuel cell.

For example, a support body in which a metal is supported on a support using the technology of the present disclosure can also be applied as a catalyst for water electrolysis. In that case, examples of the metal to be supported include noble metals such as platinum, transition metals such as copper, and typical metals such as tin. Examples include noble metals such as Pt, Ru, Ir, Au, and Ag, and transition metals such as Cu, Ni, Co, and W.

(7e) Examples of the support body include a support body in which nanoclusters other than a catalyst are supported on a support. Such support body can be used for, for example, a photosensitizer, a magnetic response material, a memory material, and the like.

(7f) As a method of rolling a multitude of supports and sprinkling each support with a multitude of nanoclusters in the gas phase, various methods can be adopted other than a method of containing the multitude of supports in the rotary barrel, rotating the rotary barrel, and supplying the multitude of nanoclusters into the rotary barrel. For example, the nanoclusters may be supplied in a state where a magnetic stirrer is disposed in the rotary barrel and the magnetic stirrer is rotated. Other than rotating the rotary barrel, vibrating or swinging a container such as a rotary barrel may be adopted.

(7g) A plurality of functions of one component in the above embodiments may be implemented by a plurality of components, or one function of one component may be implemented by a plurality of components. A plurality of functions of a plurality of components may be implemented by one component, or one function implemented by a plurality of components may be implemented by one component. A part of the configuration of the above embodiments may be omitted. At least a part of the configuration of the above embodiments may be added to or replaced with the configuration of the other embodiments.

The invention claimed is:

1. A manufacturing apparatus for support bodies in which nanoclusters are supported on each of supports in the form of fine particles, the manufacturing apparatus comprising:
a nanocluster manufacturing section configured to produce the nanoclusters in a gaseous atmosphere;
a support manufacturing unit for producing the supports in the gaseous atmosphere;
an activation mechanism configured to perform activation treatment on the supports, the activation treatment carrying out at least one of producing fixation sites on each of the supports and enhancing an activity of the fixation sites of each of the supports for fixing the nanoclusters to the supports; and
a supporting mechanism configured to cause each of the supports to support the nanoclusters in the gaseous atmosphere;
wherein the nanocluster manufacturing section includes:
a vacuum container;
a sputtering source that has a target as a cathode, performs magnetron sputtering by pulse discharge, and generates plasma;
a pulse power source that supplies pulsed power to the sputtering source;
a first inert gas supply section that supplies a first inert gas to the sputtering source;
a nanocluster growth cell that is contained in the vacuum container; and
a second inert gas introduction section that introduces a second inert gas into the nanocluster growth cell,
wherein the supporting mechanism includes a container configured to contain the supports and the nanoclusters, and
wherein the supporting mechanism is configured to rotate the container or use one or more stirrers to roll, in the gaseous atmosphere, the supports and to sprinkle, in the gaseous atmosphere, each of the supports with the nanoclusters to cause each of the supports to support the nanoclusters.

2. The manufacturing apparatus for support bodies according to claim 1, wherein the support manufacturing unit includes a fixed bed or a fluidized bed for producing the supports.

3. The manufacturing apparatus for support bodies according to claim 1, wherein the container is disposed in a path through which the nanoclusters are supplied so as to be capable of containing the nanoclusters.

4. The manufacturing apparatus for support bodies according to claim 3, further comprising a nanocluster control section configured to control at least one of a size and a structure of the nanoclusters disposed in a path through which the nanoclusters are supplied.

5. The manufacturing apparatus for support bodies according to claim 1, further comprising a voltage control mechanism capable of applying a positive or negative bias voltage to the container.

6. The manufacturing apparatus for support bodies according to claim 1, further comprising a temperature control section configured to control an inside of the supporting mechanism to a predetermined temperature.

7. A manufacturing method for support bodies in which nanoclusters are supported on each of supports, the manufacturing method comprising:
a first process of producing the nanoclusters in a gaseous atmosphere;
a process of performing activation treatment on the supports, the activation treatment carrying out at least one of producing fixation sites on each of the supports and enhancing an activity of the fixation sites of each of the supports for fixing the nanoclusters to the supports; and
a second process of causing each of the supports to support the nanoclusters in the gaseous atmosphere, and
a third process of producing the supports, wherein in the second process, the support produced in the third process are used in the gaseous atmosphere, wherein
in the first process, the nanoclusters are produced using an apparatus including:
a vacuum container;
a sputtering source that has a target as a cathode, performs magnetron sputtering by pulse discharge, and generates plasma;
a pulse power source that supplies pulsed power to the sputtering source;
a first inert gas supply section that supplies a first inert gas to the sputtering source;
a nanocluster growth cell that is contained in the vacuum container; and a second inert gas introduction section that introduces a second inert gas into the nanocluster growth cell, and
in the second process, a container configured to contain the supports and the nanoclusters is rotated or one or more stirrers are used to roll, in the gaseous atmosphere, the supports and to sprinkle, in the gaseous atmosphere, each of the supports with the nanoclusters to cause each of the supports to support the nanoclusters.

8. The manufacturing method for support bodies according to claim 7, wherein in the third process, the supports are produced using a fixed bed or a fluidized bed.

9. The manufacturing method for support bodies according to claim 7, wherein the container is disposed in a path through which the nanoclusters are supplied so as to be capable of containing the nanoclusters.

10. The manufacturing method for support bodies according to claim 9, wherein at least one of a size and a structure of the nanocluster is controlled in a path through which the nanoclusters are supplied.

11. The manufacturing method for support bodies according to claim 7, wherein a positive or negative bias voltage is applied to the container.

12. The manufacturing method for support bodies according to claim 7, wherein a part for causing each of the supports to support the nanoclusters is controlled to a predetermined temperature.

* * * * *